(12) United States Patent
Koyama

(10) Patent No.: US 6,501,227 B1
(45) Date of Patent: Dec. 31, 2002

(54) EL DISPLAY DEVICE AND ELECTRONIC DEVICE

(75) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 19 days.

(21) Appl. No.: 09/666,453

(22) Filed: Sep. 21, 2000

(30) Foreign Application Priority Data

Sep. 24, 1999  (JP) ............................................ 11-270091

(51) Int. Cl.[7] ................................................ G09G 3/10
(52) U.S. Cl. ....................... 315/169.3; 345/76; 257/72
(58) Field of Search ........................... 315/169.3, 169.1, 315/169.2, 169.4; 313/500–505; 345/63, 60, 76, 77; 257/59, 72

(56) References Cited

U.S. PATENT DOCUMENTS

| | | | |
|---|---|---|---|
| 5,807,627 A | * | 9/1998 | Friend et al. ................ 428/212 |
| 5,882,761 A | | 3/1999 | Kawami et al. |
| 5,990,629 A | | 11/1999 | Yamada et al. |
| 6,057,647 A | * | 5/2000 | Kurosawa et al. ........ 315/169.3 |
| 6,147,667 A | * | 11/2000 | Yamazaki et al. ............. 345/92 |
| 6,191,764 B1 | * | 2/2001 | Kono et al. .................... 345/76 |
| 6,246,070 B1 | * | 6/2001 | Yamazaki et al. ............. 257/40 |
| 6,255,705 B1 | * | 7/2001 | Zhang et al. ................ 257/412 |
| 6,259,138 B1 | * | 7/2001 | Ohtani et al. ................ 257/351 |
| 6,259,838 B1 | * | 7/2001 | Singh et al. ................... 385/31 |

FOREIGN PATENT DOCUMENTS

| | | |
|---|---|---|
| EP | 0 776 147 A1 | 5/1997 |
| JP | 08-078519 | 3/1996 |
| JP | 09-148066 | 6/1997 |
| JP | 10-039791 | 2/1998 |
| JP | 10-214060 | 8/1998 |
| JP | 10-232649 | 9/1998 |
| JP | 10-312173 | 11/1998 |
| JP | 03032801 | 2/2000 |

* cited by examiner

*Primary Examiner*—Don Wong
*Assistant Examiner*—Ephrem Alemu
(74) *Attorney, Agent, or Firm*—Eric J. Robinson; Robinson Intellectual Property Law Office, P.C.

(57) ABSTRACT

An EL display device which can display vivid images with a good balance of the brightnesses of emitted red color, blue color, and green color light is provided. The EL display device has a plurality of pixels each containing EL elements respectively, and the EL display device performs gradation display by controlling the time during which the plurality of EL elements emit light. The EL display device is characterized in that a voltage applied to each of the EL elements differs depending upon the color displayed by the plurality of pixels each containing the EL elements respectively.

28 Claims, 11 Drawing Sheets

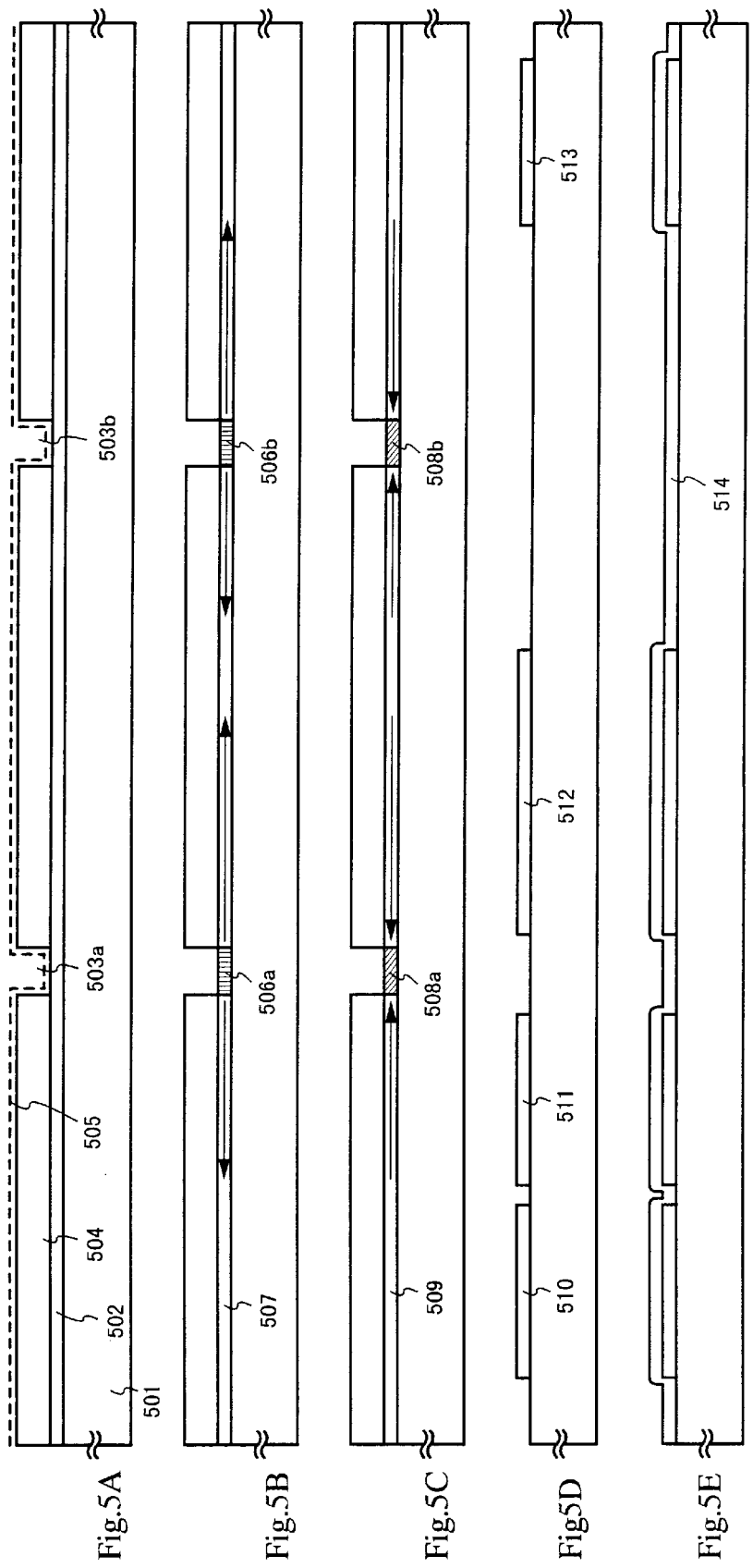

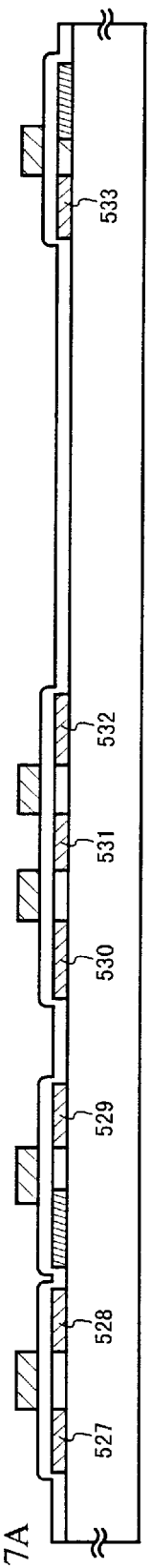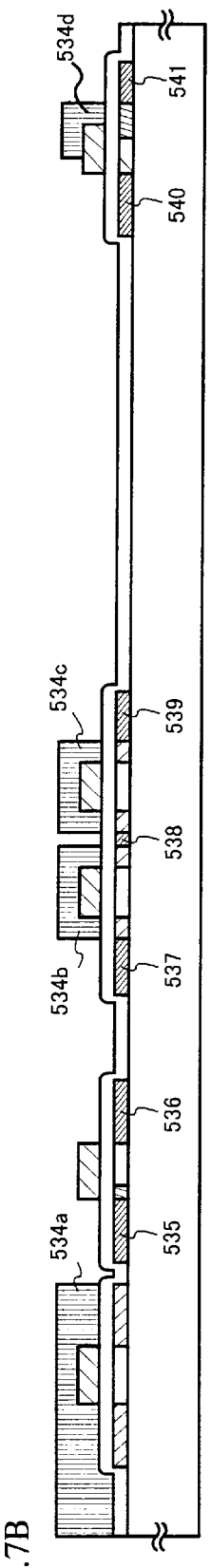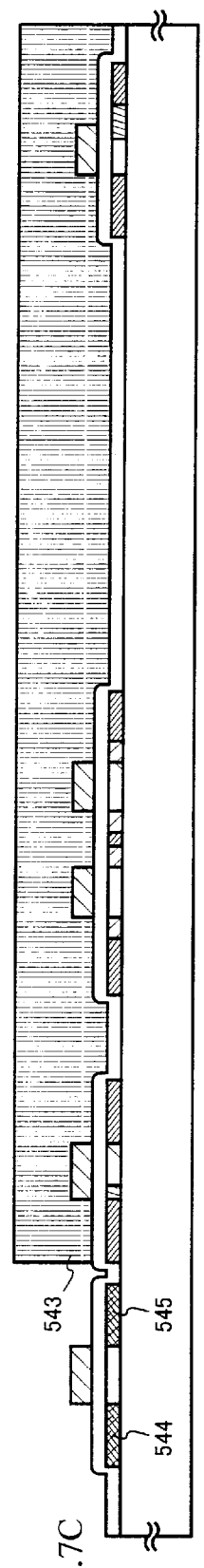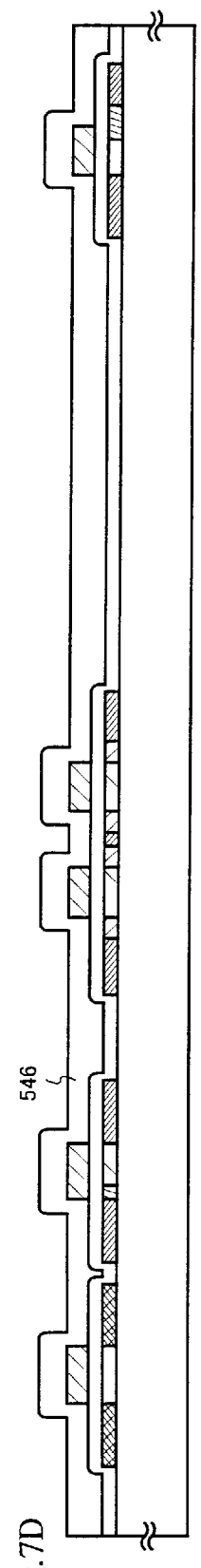

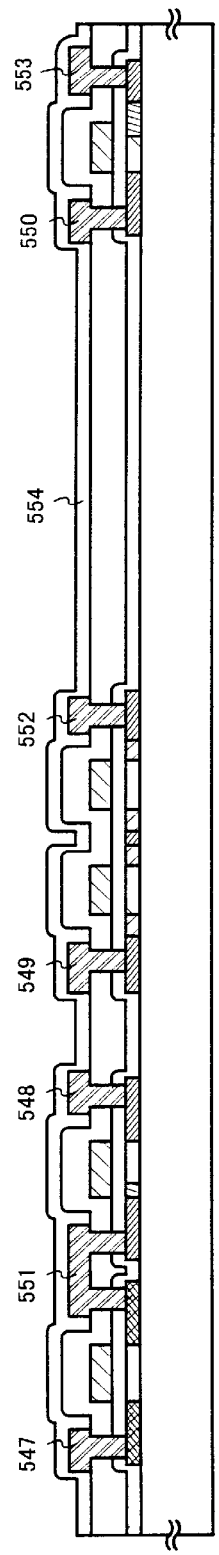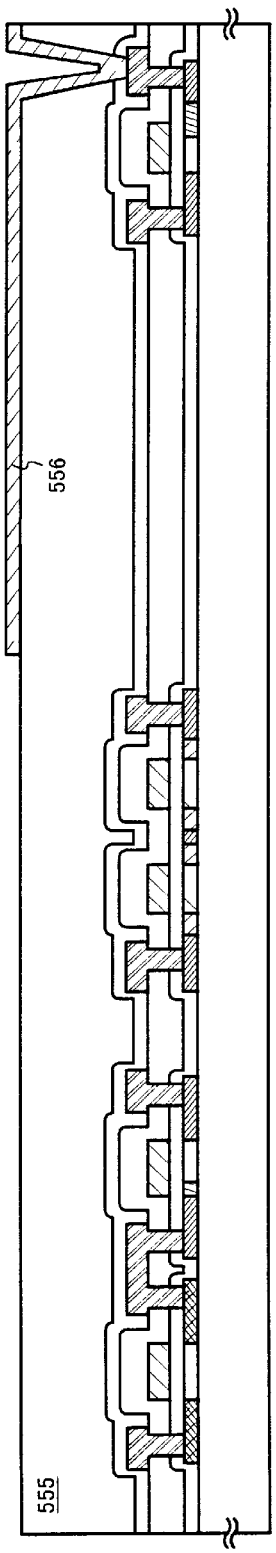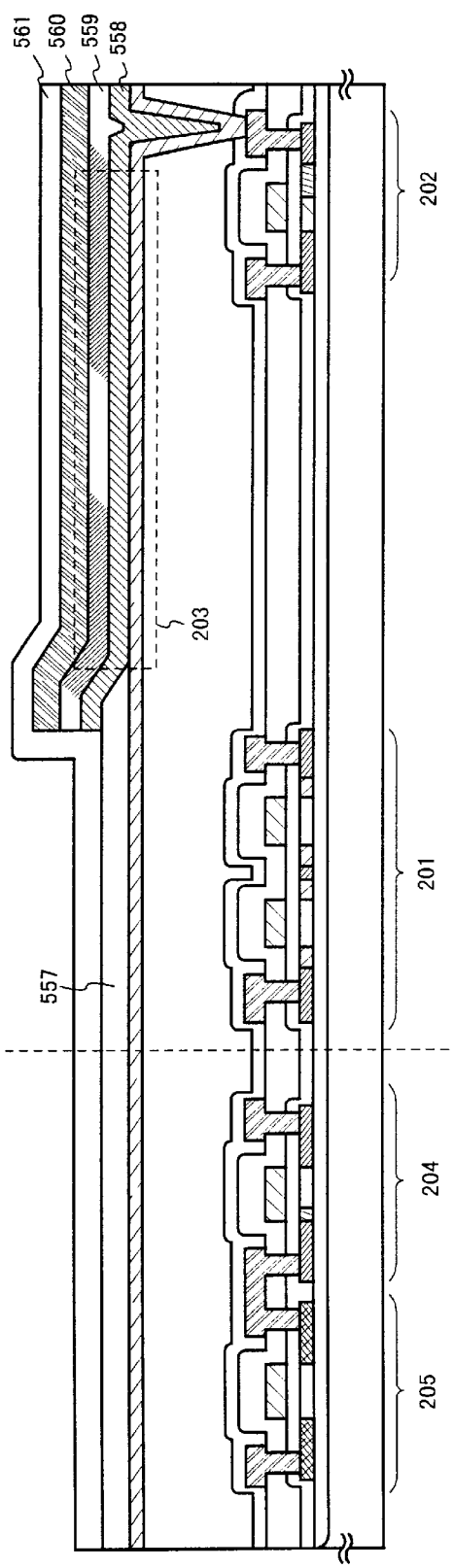
Fig.8A
Fig.8B
Fig.8C

EL DISPLAY DEVICE AND ELECTRONIC DEVICE

BACKGROUND OF THE INVENTION

1. Field of the Invention

The present invention relates to an EL (electroluminescence) display device formed with a semiconductor element (an element using a semiconductor thin film) built on a substrate, and to an electronic device comprising the EL display device as a display.

2. Description of the Related Art

Techniques of forming a TFT on a substrate have greatly advanced in recent years, and development of applications to active matrix type display devices is proceeding. In particular, a TFT using a polysilicon film has a higher electric field effect mobility (also referred to as mobility) than a TFT using a conventional amorphous silicon film, and it is capable of high speed operation. It therefore becomes possible to perform control of pixels by a driver circuit formed on the same substrate as the pixels, although conventionally by a driver circuit external to the substrate.

This type of active matrix display device obtains many advantages, such as lowered manufacturing cost, smaller display device, increased yield, and reduced throughput, by building various circuits and elements on the same substrate.

In addition, research on active matrix type EL display devices having EL elements as self-luminescing elements has become spirited. The EL display device is also referred to as organic EL display (OELD) or an organic light emitting diode (OLED).

The EL display device is a self luminescing type which differs from a liquid crystal display device. The EL element has a structure in which an EL layer is sandwiched between a pair of electrodes, and the EL layer is normally a lamination structure. A lamination structure of "a hole transporting layer, a light emitting layer, and an electron transporting layer" proposed by Tang, et al., of Eastman Kodak Co. can be given as a typical structure. This structure has extremely high light emitting efficiency, and at present nearly all EL display devices in which research and development is proceeding employ this structure.

Furthermore, additional structures such as a hole injecting layer, a hole transporting layer, a light emitting layer, and an electron transporting layer formed in order on a pixel electrode; or a hole injecting layer, a hole transporting layer, a light emitting layer, an electron transporting layer, and an electron injecting layer formed in order on a pixel electrode may also be used. An element such as a fluorescing pigment may also be doped into the EL layer.

A predetermined voltage is then applied to the EL layer having the above structure by a pair of electrodes, and recombination of carriers thus occurs in the light emitting layer, and light is emitted. Note that the light emitting of the EL element is referred to as driving the EL element throughout this specification.

In addition, note that a light emitting element formed by an anode, an EL layer, and a cathode is referred to as an EL element throughout this specification.

Roughly divided, there are four color display methods for an EL display device: a method of forming three types of EL elements corresponding to R (red), G (green), and B (blue); a method of combining white color light emitting EL elements and color filters; a method of combining blue or blue-green EL elements and fluorescing bodies (fluorescent color changing layers, CCMs); and a method of using a transparent electrode for the cathode (opposing electrode) and overlapping EL elements corresponding to RGB.

Generally, however, there are many organic EL materials with which the brightness of red color emitted light is low compared with the brightness of blue color and green color emitted light. The brightness of red color images displayed therefore becomes weaker when an organic EL material having these types of light emitting characteristics is used in an EL display device.

Further, a method of using orange color light having a slightly lower wavelength than that of red color light has been conventionally performed because the brightness of red color light is low compared to the brightness of blue and green light. However, the brightness of red color images themselves which are displayed by the EL display device is low, and when display of the red color image is attempted, it is displayed as orange.

SUMMARY OF THE INVENTION

In consideration of the above, an object of the present invention is to provide an EL display device for displaying an image which has a good balance between the desired brightnesses of red, blue, and green light, using organic EL materials with different brightnesses of red, blue, and green light.

The applicant of the present invention has made the voltage applied to an EL element which performs display of a color having a low light emission brightness higher than the voltage applied to an EL element which performs display of a color having a relatively high light emission brightness in an EL display device which performs time partitioning gradation display.

An EL driver TFT which performs control of electric current to an EL element has a relatively larger current flow than a switching TFT which controls the driving of the EL driver TFT in order to make an EL element emit light. Note that control of the driving of TFT means that an on state or an off state of the TFT is set by controlling the voltage applied to a gate electrode of the TFT. In particular, for the above structure the present invention has more current flowing in the EL driver TFTs of pixels displaying colors having low light emission brightness than in the EL driver TFTs of pixels displaying other colors. A problem therefore surfaces in that the EL driver TFTs of the pixels displaying colors having low light emission brightness degrade quicker than EL driver TFTs of pixels displaying other colors due to hot carrier injection.

The applicant of the present invention, in addition to the above structure, made the length of an LDD region of the EL driver TFTs of the pixels displaying colors having low light emission brightness longer than the length of an LDD region of the EL driver TFTs of the pixels displaying colors having high light emission brightness as measures against deterioration of the EL driver TFTs by hot carrier injection.

Note that, throughout this specification, length of the LDD region refers to the length of the LDD region in a direction which links a source region and a drain region.

Furthermore, at the same time the channel width(W) of the EL driver TFTs of the pixels displaying colors having low light emission brightness is made larger than the channel width(W) of the EL driver TFTs of the pixels displaying colors having relatively high light emission brightness.

Note that, throughout this specification, channel width (W) refers to the length of the channel region in a perpendicular direction to the direction which links the source region and the drain region.

Even though the amount of current for controlling the EL driver TFTs is increased by raising the voltage applied in accordance with the above structure, the present invention can suppress deterioration of the EL driver TFTs. In addition, it becomes possible to regulate the brightness of light emitted by the EL elements by the value of the voltage applied to the EL elements, and to display an image having vivid colors and good balance between the brightnesses of emitted light in red, blue, and green colors. Note that the present invention may employ not only the time partitioning gradation display but also the other method of the display.

The structure of the present invention is shown below.

In accordance with the present invention, an EL display device having a plurality of pixels, each containing an EL element, characterized in that:

the EL display device performs gradation display by controlling the amount of time light is emitted by the plurality of EL elements; and a voltage applied to the plurality of EL elements differs in accordance with the color displayed in the plurality of pixels containing the EL elements, is provided.

Also in accordance with the present invention, an EL display device having:

a plurality of pixels, each containing
an EL element;
an EL driver TFT for controlling light emission from the EL element; and
a switching TFT for controlling the driving of the EL driver TFT;

characterized in that:

the EL display device performs gradation display by controlling the amount of time light is emitted by the plurality of EL elements;

a voltage applied to the plurality of EL elements differs in accordance with the color displayed by the plurality of pixels each containing the EL elements;

the plurality of EL driver TFTs are composed of n-channel TFTs; and the higher the voltage applied to the plurality of EL elements, the longer the length, in the longitudinal direction of a channel, of an LDD region of the plurality of EL driver TFTs, is provided.

Further, in accordance with the present invention, an EL display device having:

a plurality of pixels, each containing:
an EL element;
an EL driver TFT for controlling light emission from the EL element; and
a switching TFT for controlling the driving of the EL driver TFT;

characterized in that:

the EL display device performs gradation display by controlling the amount of time light is emitted by the plurality of EL elements;

a voltage applied to the plurality of EL elements differs in accordance with the color displayed by the plurality of pixels each containing the EL elements;

the plurality of EL driver TFTs are composed of n-channel TFTs; and the higher the voltage applied to the plurality of EL elements, the larger the width of a channel region of the plurality of EL driver TFTs, is provided.

Also in accordance with the present invention, an EL display device having:

a plurality of pixels, each containing:
an EL element;
an EL driver TFT for controlling light emission from the EL element; and
a switching TFT for controlling the driving of the EL driver TFT;

characterized in that:

the EL display device performs gradation display by controlling the amount of time light is emitted by the plurality of EL elements;

a voltage applied to the plurality of EL elements differs in accordance with the color displayed by the plurality of pixels each containing the EL elements;

the plurality of EL driver TFTs are composed of n-channel TFTs;

the higher the voltage applied to the plurality of EL elements, the longer the length, in the longitudinal direction of a channel, of an LDD region of the plurality of EL driver TFTs; and the higher the voltage applied to the plurality of EL elements, the larger the width of a channel region of the plurality of EL driver TFTs, is provided.

In accordance with the present invention, an EL display device having:

a plurality of pixels, each containing:
an EL element;
an EL driver TFT for controlling light emission from the EL element; and
a switching TFT for controlling the driving of the EL driver TFT;

characterized in that:

the EL display device performs gradation display by controlling the amount of time light is emitted by the plurality of EL elements;

a voltage applied to the plurality of EL elements differs in accordance with the color displayed by the plurality of pixels each containing the EL elements; and the higher the voltage applied to the plurality of EL elements, the larger the width of a channel region of the plurality of EL driver TFTs, is provided.

The present invention may also be characterized in that the amount of time light is emitted by the plurality of EL elements is controlled by a digital signal input to the switching TFTs.

The present invention may also be an electronic device employing the above EL display device.

BRIEF DESCRIPTION OF THE DRAWINGS

In the accompanying drawings:

FIGS. 5A to 5E are diagrams showing a method of manufacturing an EL display device;

FIGS. 7A to 7D are diagrams showing the method of manufacturing the EL display device;

FIGS. 8A to 8C are diagrams showing the method of manufacturing the EL display device;

FIGS. 10A to 10E are diagrams showing specific examples of electronic equipment.

DETAILED DESCRIPTION OF THE PREFERRED EMBODIMENTS

Embodiment Mode

Figure 1A:
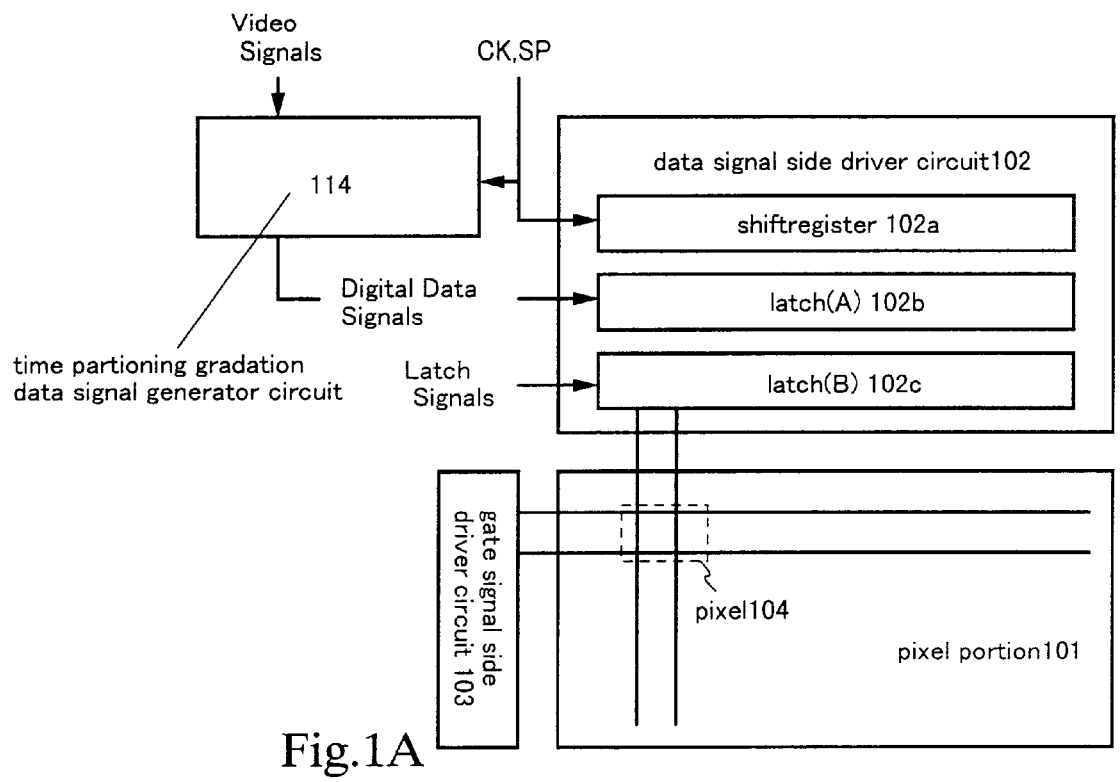
FIGS. 1A and 1B are diagrams showing the structure of an EL display device of the present invention.
Figure 1B:
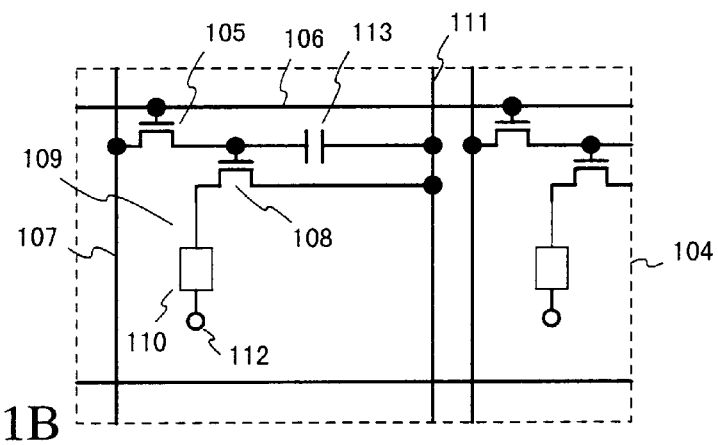

FIGS. 1A and 1B show the circuit structure of an EL display device of the present invention. The EL display device of FIG. 1A has a pixel portion 101, and a data signal side driver circuit 102 and a gate signal side driver circuit 103 arranged in the periphery of the pixel portion, which are all composed of TFTs formed on a substrate. Note that although the EL display device has one data signal side driver circuit and one gate signal side driver circuit in the embodiment mode of the present invention, two data signal side driver circuits may also be used in the present invention. Furthermore, two gate signal side driver circuits may also be used.

The data signal side driver circuit 102 fundamentally contains a shift register 102a, a latch (A) 102b and a latch (B) 102c. Further, clock pulses (CK) and start pulses (SP) are input to the shift register 102a, digital data signals are input to the latch (A) 102b, and latch signals are input to the latch (B) 102c.

The digital data signals input to the pixel portion are formed by a time partitioning gradation data signal generator circuit 114. This circuit, along with converting a video signal which is an analog signal or a digital signal (a signal containing image information) into a digital data signal for performing time partitioning gradation, is a circuit which generates timing pulses or the like which are necessary for performing time partitioning gradation display.

Typically, a means of partitioning one frame period into a plurality of sub-frame periods corresponding to n-bit gradations (where n is a real number equal to or greater than 2), a means of selecting an address period and a sustain period in the plurality of sub-frame periods, and a means of setting the sustain periods so that Ts1 : Ts2: Ts3: . . . : Ts(n-1): Ts(n)=$2^0$: $2^{-1}$: $2^{-2}$: . . . : $2^{-(n-2)}$: $2^{-(n-1)}$ are included in the time partitioning gradation data signal generator circuit 114.

The time partitioning gradation data signal generator circuit 114 may also be formed external to the EL display device of the present invention. In this case, it becomes a structure that the digital signals formed there are input to the EL display device of the present invention. An electronic device with the EL display device of the present invention as a display thus contains the EL display device of the present invention and the time partitioning gradation data signal generator circuit as separate components.

Further, the EL display device of the present invention may also be implemented with a form such as using an IC chip for the time partitioning gradation data signal generator circuit 114. In this case, it becomes a structure that the digital data signals formed by the IC chip are input to the EL display device of the present invention. An electronic device with the EL display device of the present invention as a display thus contains the EL display device of the present invention in which the IC chip containing the time partitioning gradation data signal generator circuit is implemented.

Further, the time partitioning gradation data signal generator circuit 114 may also be formed of TFTs on the same substrate as the pixel portion 101, the date signal side driver circuit 102, and the gate signal side driver circuit 103. In this case, all processing can be performed on the substrate provided that the video signal containing image information is input to the EL display device. It is of course preferable to form the time partitioning gradation data signal generator circuit with TFTs having polysilicon films used in the present invention as active layers. Furthermore, in this case an electronic device having the EL display device of the present invention as a display has the time partitioning gradation data signal generator circuit incorporated within the EL display device itself, and it is possible to make the electronic device small.

A plurality of pixels 104 are arranged in a matrix state in the pixel portion 101. An expanded diagram of the pixels 104 is shown in FIG. 1B. Reference numeral 105 denotes a switching TFT in FIG. 1B. A gate electrode of the switching TFT 105 is connected to a gate wiring 106 which inputs a gate signal. One of a drain region and a source region of the switching TFT 105 is connected to a data wiring (also referred to as a source wiring) 107 for inputting a digital data signal, and the other is connected to a gate electrode of an EL driver TFT 108.

The digital data signal contains information of "0" and "1", and one of the digital data signals "0" and "1" has Hi electric potential, while the other has Lo electric potential.

Further, a source region of the EL driver TFT 108 is connected to an electric power supply line 111, and a drain region is connected to an EL element 110.

The EL element 110 is composed of a pixel electrode connected to the drain region of the EL driver TFT 108 and an opposing electrode formed opposing the pixel electrode and sandwiching an EL layer, and the opposing electrode is connected to a common power supply 112 which maintains a fixed electric potential (common electric potential).

Note that when using an anode of the EL element 110 as the pixel electrode, and using a cathode as the opposing electrode, it is preferable that the EL driver TFT 108 be a p-channel TFT.

Note that when using the cathode of the EL element 110 as the pixel electrode, and using the anode as the opposing electrode, it is preferable that the driver TFT 108 be an n-channel TFT.

The electric potential applied to the electric power supply line 111 is referred to as an EL driver electric potential. The EL driver electric potential when the EL element is emitting light is referred to as an on EL driver electric potential. Further, the EL driver electric potential when the EL element is not emitting light is referred to as an off EL driver electric potential.

In addition, the difference between the EL driver electric potential and the common electric potential is referred to as an EL driver voltage. The EL driver voltage when the EL element is emitting light is referred to as an on EL driver voltage. Further, the EL driver voltage when the EL element is not emitting light is referred to as an off EL driver voltage.

The value of the on EL driver voltage applied to the electric power supply line 111 changes in accordance with the color (red, green, blue) displayed in the corresponding pixel. For example, when the brightness of red color light emitted by an organic EL material used is less than the brightnesses of blue and green color emitted light, the on EL driver voltage applied to the electric power supply lines connected to the pixels displaying red color is set higher than the on EL driver voltage applied to the electric power supply lines connected to the pixels displaying blue and green colors.

Note that a resistive body may also be formed between the drain region of the EL driver TFT 108 and the EL element 10 having the pixel electrode. It becomes possible to control the amount of current supplied to the EL element from the EL driver TFT, and to prevent any influence resulting in dispersion of the characteristics of the EL driver TFT with forming the resistive body. The resistive body may be an element displaying a resistance sufficiently larger than the on resistance of the EL driver TFT 108, and therefore there are no limitations in its structure. Note that the on resistance is the value of the drain voltage of the TFT divided by the drain current flowing at that the time. The resistance value of the resistive body may be selected in a range of 1 kΩ to 50 MΩ (preferably between 10 kΩ and 10 MΩ, more preferably between 50 kΩ and 1 MΩ). Use of a semiconductor layer having high resistance value as the resistive body is preferably because it is easy to form.

In order to maintain the gate voltage of the EL driver TFT 108 when the switching TFT 105 is in a non-selected state (off state), a capacitor 113 is provided. The capacitor 113 is connected to the drain region of the switching TFT 105 and to the electric power supply line 111.

Figure 2:
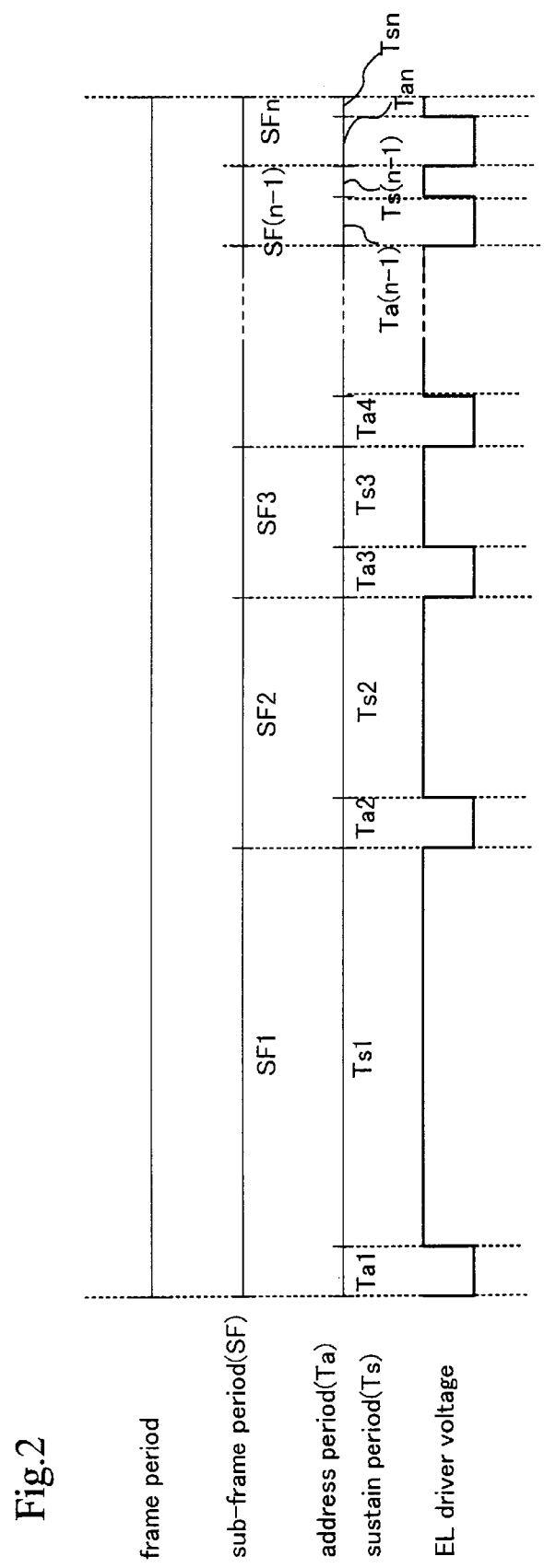
FIG. 2 is a diagram for explaining a time partitioning gradient method display mode of the present invention.

Time partitioning gradation display is explained next using FIGS. 1A to 2. An example of performing $2^n$ gradation display by an n-bit digital driving method is explained here.

First, one frame period is partitioned into n sub-frame periods (SF1 to SFn). Note that a period in which all of the pixels of the pixel portion display one image is referred to as one frame period. The emission frequency is equal to or greater than 60 Hz in a normal EL display, namely 60 or more frame periods are formed during one second, and 60 or more images are displayed during one second. If the number of images displayed during one second becomes less than 60, then flicker of the image begins to become visually apparent. Note that a plurality of periods into which one frame period is additionally partitioned are referred to as sub-frames. As the number of gradations becomes large, the number of partitions of one frame increases and the driver circuit must be driven at a high frequency. (See FIG. 2.)

One sub-frame period is divided into an address period (Ta) and a sustain period (Ts). The address period is the time required for inputting data to all of the pixels during one sub-frame period, and the sustain period (also referred to as a turn on period) denotes a period in which the EL element is made to emit light.

The lengths of the address periods (Ta1 to Tan) having n sub-frame periods (SF1 to SFn), respectively, are all fixed. The sustain periods (Ts) having SF1 to SFn, respectively, become Ts1 to Tsn.

The lengths of the sustain periods is set so as to become Ts1: Ts2: Ts3: . . . : Ts(n−1): Tsn=$2^0$: $2^{-1}$: $2^{-2}$: . . . : $2^{-(n-2)}$: $2^{-(n-1)}$. Note that the order of appearance of SF1 to SFn may be set arbitrarily. Gradation display of the desired values out of the $2^n$ gradations can be performed by combining the sustain periods.

First, the electric power supply line 111 is set into a state of maintaining the off EL driver electric potential, the gate signal is applied to the gate wirings 106, and the switching TFTs 105 connected to the gate wirings 106 all are set into the on state. Note that the off EL driver electric potential is an electric potential of an order at which the EL elements do not emit light, nearly the same as the common electric potential.

Then, after setting the switching TFTs 105 into the on state, or at the same time that the switching TFTs 105 are set into the on state, the digital data signal having "0" or "1" information is input into the source region of the switching TFTs 105.

The digital data signal is input, through the switching TFTs 105, into the capacitors 113 connected to the gate electrodes of the EL driver TFTs 108, and stored. The period through which the digital data signal is input into all of the pixels is the address period.

After completion of the address period, the electric power supply lines 111 are maintained at the on EL driver electric potential, the switching TFTs are placed in the off state, and the digital data signal stored in the capacitors 113 is input to the gate electrodes of the EL driver TFTs 108.

Note that the size of the on EL driver electric potential is on an order such that the EL elements emit light between the on EL driver electric potential and the common electric potential. It is preferable that the electric potential applied to the anodes is larger than the electric potential applied to the cathodes. In other words, when the anodes are used as the pixel electrodes, it is preferable to set the on EL driver electric potential to be greater than the common electric potential. On the other hand, when the cathodes are used as the pixel electrodes, it is preferable to set the on EL driver electric potential to be less than the common electric potential.

When the digital data signal has "0" information in this embodiment mode, the EL driver TFTs 108 are set to the off state, and the on EL driver voltage applied to the electric power supply lines 111 is not applied to the anodes (pixel electrodes) of the EL elements 110.

For the case of "1" information, on the other hand, the EL driver TFTs 108 become set to the on state, and the on EL driver voltage applied to the electric power supply lines 111 is applied to the anodes (pixel electrodes) of the EL elements 110.

As a result, the EL elements 110 of pixels to which the digital data signal containing "0" information is applied do not emit light. The EL elements 110 of pixels to which the digital data signal containing "1" information is applied emit light. The period until the light emission is complete is the sustain period.

The period for which the EL elements 110 are made to emit light (the pixels are turned on) is any period from Ts1 to Tsn. The predetermined pixels are turned on for the Tsn period here.

The address period is again entered next, and when the data signal is input to all of the pixels, the sustain period is entered. At this point any of the periods from Ts1 to Ts(n−1) may become the sustain period. The predetermined pixels are turned on for the period Ts(n−1) here.

A similar operation is repeated thereafter for the remaining n−2 sub-frames, the sustain periods Ts(n−2), Ts(n−3), . . . , and Ts1 are set one after another, and the predetermined pixels are turned on during the respective sub-frames.

After the n sub-frame periods have appeared, one frame period is completed. Gradation of the pixels can be performed by calculating the length of the sustain period during which the pixels are turned on, namely the sustain period directly after the address period in which the digital data signal containing "1" information is applied to the pixels. For example, in a case of a pixel emitting light for all of the sustain period the brightness is taken as 100% when n=8, a brightness of 75% can be expressed by pixels emitting light in Ts1 and Ts2, and when Ts3, Ts5, and Ts8 are selected, a brightness of 16% can be expressed.

In addition, the value of the on EL driver voltage applied to the electric power supply lines 111 changes in accordance with the color (red, green, blue) displayed by the corresponding pixels with the present invention. For example, when the brightness of red color light emission from the organic EL material used is lower than the brightness of blue and green color light emission, the on EL driver voltage applied to the electric power supply lines connected to the pixels displaying red color is set so as to become larger than the on EL driver voltage applied to the electric power supply lines connected to the pixels displaying blue and green colors.

Note that it is also necessary to suitably change the value of the electric potential of the digital data signals and the gate signals at the same time as changing the value of the on EL driver electric potential.

The structure of the EL driver TFT in the present invention is explained next. The EL driver TFT is composed of a p-channel TFT or an n-channel TFT in the present invention. An EL driver TFT structured by a p-channel TFT does not have an LDD region, and an EL driver TFT structured by an n-channel TFT has an LDD region.

The amount of controlled current is higher for the EL driver TFT than for the switching TFT. In particular, the EL driver TFTs of pixels displaying colors having low light emission brightnesses have a larger amount of controlled current than the EL driver TFTs of pixels displaying other colors.

When the EL driver TFTs are p-channel TFTs, the channel width (W) of the EL driver TFTs of pixels displaying colors having low light emission brightnesses is made larger than the channel width (W) of the EL driver TFTs of pixels displaying colors having relatively high light emission brightnesses. Even though the amount of controlled current of the EL driver TFTs of pixels displaying colors having low light emission brightnesses is larger than that of the EL driver TFTs of pixels displaying other colors with the above structure, the EL driver TFTs of pixels displaying colors having low light emission brightnesses can be prevented from quickly deteriorating due to hot carrier injection.

By also making the channel width (W) of the EL driver TFTs of pixels displaying colors having low light emission brightnesses larger than the channel width (W) of the EL driver TFTs of pixels displaying colors having relatively high light emission brightnesses for cases in which the EL driver TFTs are n-channel TFTs, it is possible to prevent quick deterioration of the EL driver TFTs of pixels displaying colors having low light emission brightnesses due to hot carrier injection.

When the EL driver TFTs are n-channel TFTs, even without having the above structure, by making the length of the LDD region of the EL driver TFTs of pixels displaying colors having low light emission brightnesses longer than the length of the LDD region of the EL driver TFTs of pixels displaying colors having a relatively high light emission brightness, the EL driver TFTs of pixels displaying colors having low light emission brightnesses can be prevented from deteriorating due to hot carrier injection. For cases of the EL driver TFTs being n-channel TFTs, they may have both structures, one in which the channel width (W) of the EL driver TFTs differs by pixel as stated above, and one in which the length of the LDD region of the EL driver TFTs differs by pixel.

With the present invention, it becomes possible to regulate the light emission brightness of the EL elements of targeted pixels by the value of the on EL driver electric potential applied to the EL elements in the above structure, and vivid images with good balance in the light emission brightnesses of red, blue, and green light can be displayed. In addition, by the on EL driver voltage becoming larger, even if the amount of controlled current in the EL driver TFTs increases, degradation of the EL driver TFTs can be suppressed.

It becomes possible to perform clear multi-gradation display with the present invention by time partitioning gradation display. And even if the amount of controlled current for the EL driver TFTs increases due to the applied voltage becoming larger, degradation of the EL driver TFTs can be suppressed.

Embodiment 1

Time partitioning gradation display for a case of performing full color display of 256 gradations (16,770,000 colors) by an 8-bit digital driver method is explained in embodiment 1. Driving of an EL display device using an organic EL material in which the light emission brightness of the color red is less than the light emission brightnesses of the colors blue and green is explained in embodiment 1.

Figure 3:
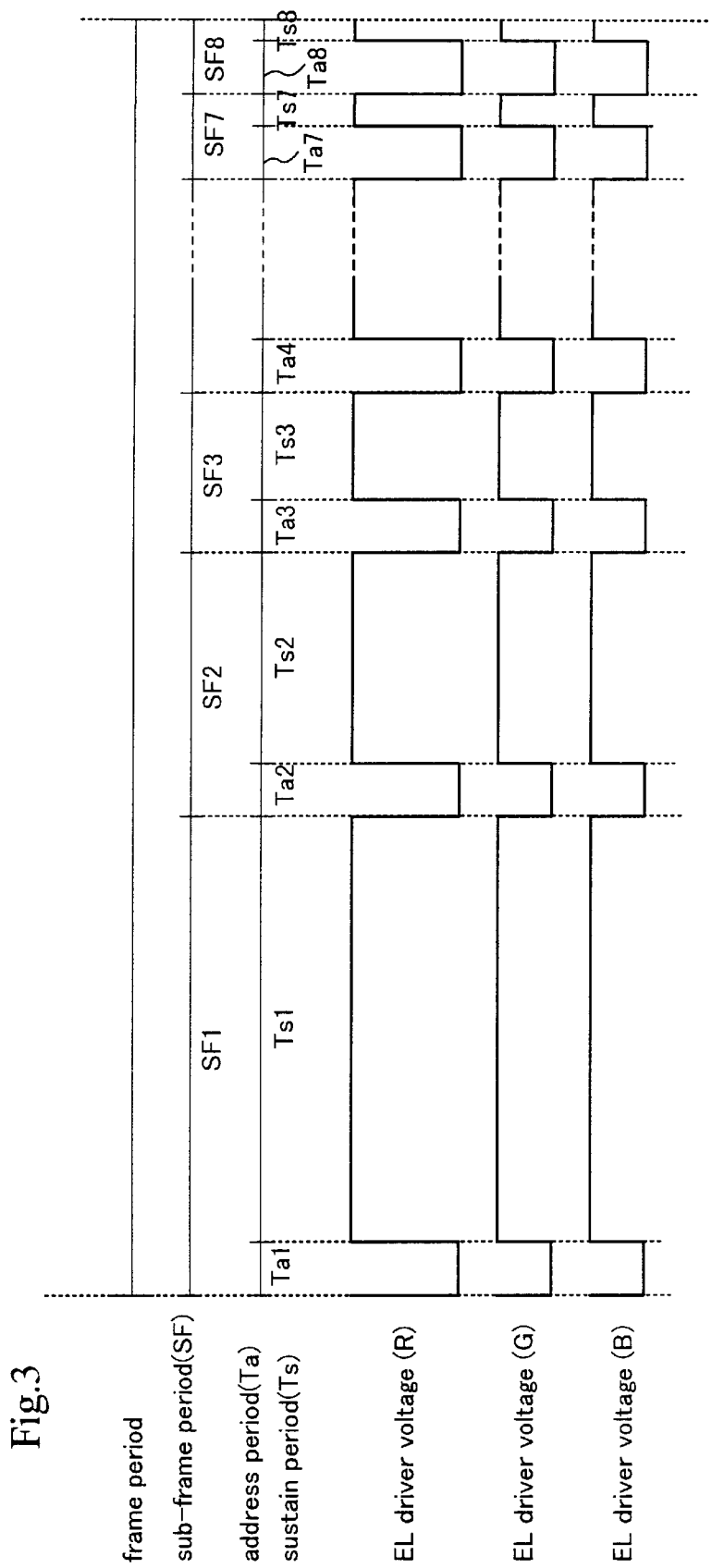
FIG. 3 is a diagram for explaining a time partitioning gradient method display mode of the present invention.

First, one frame period is partitioned into 8 sub-frame periods (SF1 to SF8). The emission frequency is set at 60 Hz in the EL display device of embodiment 1, 60 frame periods are formed in one second, and 60 images are displayed in one second. (See FIG. 3.)

One sub-frame period is divided into an address period (Ta) and a sustain period (Ts). The lengths of the address periods (Ta1 to Ta8) of SF1 to SF8 are respectively all fixed. The sustain periods (Ts) of SF1 to SF8 are referred to as Ts1 to Ts8, respectively.

The length of the sustain periods is set so as to become Ts1: Ts2: Ts3: Ts4: Ts5: Ts6 : Ts7: Ts8=1: $1/2$:$1/4$: $1/8$: $1/16$: $1/32$: $1/64$: $1/128$. Note that the appearance order of SF1 to SF8 may be arbitrary. By combining the sustain periods, a desired gradation display out of the 256 gradations can be performed.

First, electric power supply lines are set in a state in which off EL driver electric potential is maintained, a gate signal is applied to gate wirings, and switching TFTs connected to the gate wirings are all set to an on state. The off EL driver electric potential is set to 0 V in embodiment 1. Note that anodes of EL elements are connected to the electric power supply lines as pixel electrodes, and cathodes are connected to a common power source as opposing electrodes in embodiment 1.

After the switching TFTs are set in the on state, or at the same time that the switching TFTs are set in the on state, a digital data signal having "0" or "1" information is input to source regions of the switching TFTs.

The digital data signal is input to capacitors connected to gate electrodes of the EL driver TFTs through the switching TFTs, and stored. The period up until the digital data signal is input to all of the pixels is the address period.

After completion of the address period, the electric power supply lines are maintained at the on EL driver electric potential, the switching TFTs are placed in the off state, and the digital data signal stored in the capacitors is input to the gate electrodes of the EL driver TFTs. The electric power supply lines connected to pixels for displaying the color red are maintained at a 10 V of the on EL driver electric potential during the sustain period in embodiment 1. Further, the electric power supply lines connected to the pixels for displaying the colors green and blue are maintained at 5 V of the on EL driver electric potential.

When the digital data signal has "0" information in embodiment 1, the EL driver TFTs are set into the off state, and the on EL driver voltage applied to the electric power supply lines is not applied to the anodes (pixel electrodes) of the EL elements.

For the case of "1" information, on the other hand, the EL driver TFTs become set to the on state, and the on EL driver voltage applied to the electric power supply lines is applied to the anodes (pixel electrodes) of the EL elements.

As a result, the EL elements of pixels to which the digital data signal containing "0" information is applied do not emit light. The EL elements of pixels to which the digital data signal containing "1" information is applied emit light. The period until the light emission is complete is the sustain period.

The period in which the EL elements are made to emit light (the pixels are turned on) is any period from Ts1 to Ts8. The predetermined pixels are turned on for the Ts8 period here.

The address period is again entered next, and when the data signal is input to all of the pixels, the sustain period is entered. At this point any of the periods from Ts1 to Ts7 may become the sustain period. The predetermined pixels are turned on for the period Ts7 here.

A similar operation is repeated thereafter for the remaining 6 sub-frames, the sustain periods Ts6, Ts5, . . . , Ts1, are set one after another, and the predetermined pixels are turned on during the respective sub-frames.

After the 8 sub-frame periods have appeared, one frame period is completed. Gradation of the pixels can be performed by calculating the length of the sustain period during which the pixels are turned on, namely the sustain period directly after the address period in which the digital data signal containing "1" information is applied to the pixels. For example, in a case of a pixel emitting light for all of the sustain period the brightness is taken as 100%, a brightness of 75% can be expressed by pixels emitting light in Ts1 and Ts2, and when Ts3, Ts5, and Ts8 are selected, a brightness of 16% can be expressed.

Note that it is also necessary to suitably change the value of the electric potential of the digital data signals and the gate signals at the same time as changing the value of the EL driver electric potential.

In accordance with the above structure, it becomes possible to regulate the light emission brightness of the EL elements of targeted pixels by the value of the on EL driver electric potential applied to the EL elements in the above structure, and it becomes also possible to perform clear multi-gradation display by time partitioning gradation display, with the present invention. Specifically, the balance of light emission brightnesses of red light, blue light, and green light from EL elements using an organic EL material, having a red color light emission brightness less than the light emission brightnesses of blue and green colors, becomes better, and it becomes possible to display vivid images. Furthermore, time partitioning gradation display is performed in accordance with a digital signal, and a high definition image with good color reproduction and no gradation defects due to dispersion in characteristics of the EL driver TFTs can be obtained.

Embodiment 2

Figure 4:
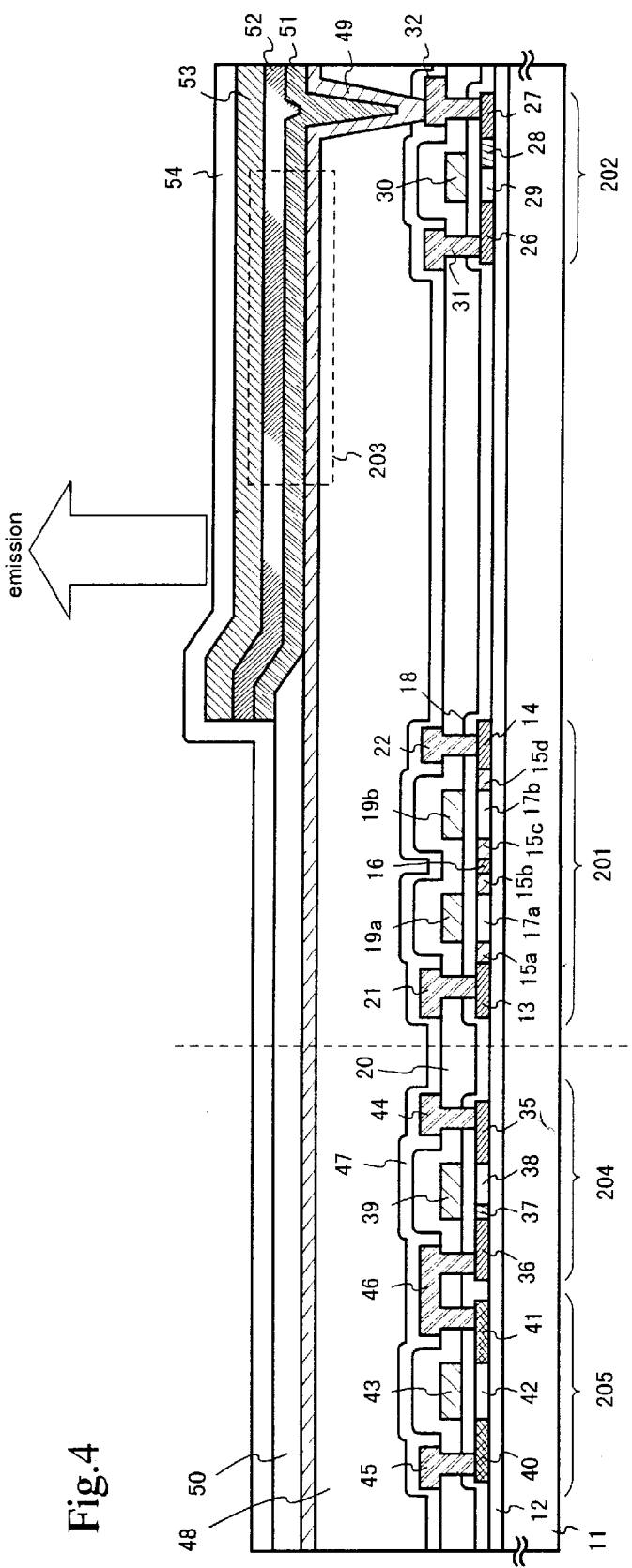
FIG. 4 is a diagram showing the cross sectional structure of an EL display device of the present invention.

Next, reference is made to FIG. 4 schematically showing the sectional structure of the EL display device of the present invention. This embodiment explains the example of a cathode of an EL element connected to the drain region of the EL driver TFT.

In FIG. 4, reference numeral 11 is a substrate, and 12 is an insulating film that is a base (hereinafter, this film is designated as base film). For the substrate 11, use can be made of a light transmissible substrate, representatively, a glass substrate, a quartz substrate, a glass ceramic substrate, or a crystallization glass substrate. However, it must be resistible to the highest processing temperature in a manufacturing process.

The base film 12 is effective especially in using a substrate that contains a movable ion or a substrate that has conductivity, but it is not necessarily disposed on the quartz substrate. An insulating film that contains silicon can be used as the base film 12. It should be noted that, in this specification, "insulating film that contains silicon" signifies an insulating film in which oxygen or nitrogen is added to silicon at a predetermined ratio (SiOxNy: x and y are arbitrary integers), such as a silicon oxide film, a silicon nitride film or a silicon nitride oxide film.

Reference numeral 201 is a switching TFT, and 202 is a EL driver TFT. Both of them are formed by an n-channel type TFT. It is also possible to use both the n-channel type TFT and the p-channel type TFT for the switching TFT and the EL driver TFT.

Since the electron field-effect mobility of the n-channel type TFT is larger than that of the p-channel type TFT, the n-channel type TFT can work at a higher operation speed and allow a heavy-current to flow easily. Concerning the size of the TFT required when the same amount of current is passed, the n-channel type TFT is smaller. Therefore, it is desirable to use the n-channel type TFT as the EL driver TFT because the effective luminescence area of an image display panel is widened.

The switching TFT 201 is made up of an active layer that includes a source region 13, a drain region 14, LDD regions 15a–15d, an isolation region 16, and channel formation regions 17a, 17b, a gate insulating film 18, gate electrodes 19a, 19b, a 1st interlayer insulating film 20, a source wiring line 21, and a drain wiring line 22. The gate insulating film 18 or the 1st interlayer insulating film 20 can be common to all TFTs on the substrate, or can be varied according to circuits or elements.

In the switching TFT 201 shown in FIG. 4, the gate electrodes 19a, 19b are connected electrically, in other words, a so-called double gate structure is established. Not only the double gate structure but also a so-called multi gate structure, such as a triple gate structure, can be established, of course. The multi gate structure signifies a structure including an active layer that has two channel formation regions or more connected in series.

The multi gate structure is very effective to decrease an OFF-state current, and if the OFF-state current of the switching TFT is decreased sufficiently, the capacity necessary for the capacitor which is connected to the gate electrode of the EL driver TFT can be reduced. That is, since the possession area of the capacitor can be reduced, the multi gate structure is also effective to widen the effective luminescence area of the EL element.

In the switching TFT 201, the LDD regions 15a–15d are disposed not to overlap with gate electrodes 19a and 19b, the gate insulating film 18 therebetween. The thus built structure is very effective to decrease the OFF-state current. The length (width) of the LDD regions 15a–15b is 0.5–3.5 μm, representatively, 2.0–2.5 μm.

It is more desirable to form an offset region (i.e., region formed with a semiconductor layer whose composition is the same as the channel formation region, and in which a gate voltage is not applied) between the channel formation region and the LDD region, in order to decrease the OFF-state current. In the multi gate structure that has two gate electrodes or more, the isolation region 16 (i.e., region whose concentration is the same and to which the same impurity element is added as the source region or the drain region) formed between the channel formation regions is effective to decrease the OFF-state current.

The EL driver TFT 202 is made up of an active layer that includes a source region 26, a drain region 27, an LDD region 28, and a channel formation region 29, a gate insulating film 18, a gate electrode 30, the 1st interlayer insulating film 20, a source wiring line 31, and a drain wiring line 32. In this embodiment, the EL driver TFT 202 is an n-channel type TFT.

The drain region 14 of the switching TFT 201 is connected to the gate electrode 30 of the EL driver TFT202. To make more precisely explanation without showing by the figure, the gate electrode 30 of the EL driver TFT 202 is connected electrically to the drain region 14 of the switching TFT 201 through the drain wiring line 22(also called connection wiring line). Further the gate electrode 30 can be a multi gate structure instead of a single gate structure. The source wiring line 31 of the EL driver TFT 202 is connected to the current-feed line (not shown).

The EL driver TFT 202 is an element to control the amount of current supplied to the EL element, and a comparatively large amount of current can flow therethrough. Therefore, preferably, the channel-width (W) is designed to be greater than the channel-width of the switching TFT. Additionally, preferably, the channel-length (L) is designed to be long so that an excessive current does not flow through the EL driver TFT 202. A desirable value is 0.5–2 mA (1–1.5 mA preferably) per pixel.

Specifically in Embodiment 1, the EL driver TFTs of pixels displaying low light emission brightness color controls larger amount of current than the EL driver TFTs of pixels displaying other color controls current. Accordingly, the degradation due to hot carrier injection of the EL driver TFTs of pixels displaying low light emission brightness color is coming earlier than that of the EL driver TFTs of pixels displaying other color.

The length of an LDD region of the EL driver TFTs of pixels displaying the low light emission color is made longer than the length of an LDD region of EL driver TFTs pixels displaying comparative high light emission brightness color. It is possible to suppress the degradation of the EL driver TFTs due to the hot carrier injection by the amount of current controlled by the EL driver TFTs increased.

To suppress the deterioration of TFT, it is also effective to thicken the film thickness of the active layer (specifically, the channel formation region) of the EL driver TFT 202 (50–100 nm preferably, and 60–80 nm further preferably). On the other hand, from the viewpoint of decreasing the OFF-state current in the switching TFT 201, it is also effective to thin the film thickness of the active layer (specifically, the channel formation region)(20–50 nm preferably, and 25–40 nm further preferably).

The structure of the TFT formed in the pixel was described above. In this formation, a driving circuit is also formed at the same time. A CMOS circuit that is a base unit to form the driving circuit is shown in FIG. 4.

In FIG. 4, a TFT that has a structure to decrease the hot carrier injection without reducing the operation speed to the utmost is used as the n-channel type TFT 204 of the CMOS circuit. The driving circuit described herein is the data signal side driving circuit and the gate signal side driving circuit. It is also possible to form other logic circuits (level shifter, A/D converter, signal division circuit, etc.), of course.

The active layer of the n-channel type TFT 204 of the CMOS circuit includes a source region 35, a drain region 36, an LDD region 37, and a channel formation region 38. The LDD region 37 overlaps with the gate electrode 39, with the gate insulating film 18 therebetween.

The reason for forming the LDD region 37 only on the drain region 36 side is not to reduce the operation speed. There is no need to worry about the OFF-state current value in the n-channel type TFT 204. Instead, the operation speed should be rated above it. Therefore, preferably, the LDD region 37 is completely laid on the gate electrode, thus reducing a resistance component as much as possible. That is, a so-called offset should be omitted.

In the p-channel type TFT 205 of the CMOS circuit, there is no need to provide the LDD region especially because the deterioration caused by the hot carrier injection is quite negligible. Therefore, the active layer includes a source region 40, a drain region 41, and a channel formation region 42. The gate insulating film 18 and the gate electrode 43 are disposed thereon. It is also possible to dispose the LDD region as well as the n-channel type TFT 204 in order to take countermeasures against the hot carrier, of course.

The n-channel type TFT 204 and the p-channel type TFT 205 are covered with the first interlayer insulating film 20, and the source wiring lines 44, 45 are formed. The drain region of the n-channel type TFT 204 and the p-channel type TFT 205 are connected each other electrically by the drain wiring line 46.

Reference numeral 47 is a first passivation film. The film thickness thereof is 10 nm–1 $\mu$m (200–500 nm preferably). An insulating film including silicon (especially, a silicon nitride oxide film or a silicon nitride film is desirable) can be used as its material. The passivation film 47 serves to protect a formed TFT from alkali metal and water. The EL layer finally disposed above the TFT (especially the driving TFT) sodium. In other words, the first passivation film 47 serves also as a protective layer by which the alkali metal (movable ions) is not allowed to enter the TFT side.

Reference numeral 48 is a second interlayer insulating film, and serves as a flattening film to flatten level differences formed by the TFT. Preferably, an organic resin film, such as polyimide, polyimide, acrylic resin, or BCB (benzocyclobutene) is used as the second interlayer insulating film 48. These organic resin films have an advantage in that a good smooth plane can be easily formed, and the dielectric constant is low. It is preferable to entirely absorb the level difference caused by the TFT by means of the second interlayer insulating film because the EL layer is very sensitive to ruggedness. Additionally, it is preferable to form a low-dielectric constant material thick, in order to decrease the parasitic capacitance formed between the gate wiring line or the data wiring line and the cathode of the EL element. Therefore, preferably, the film thickness thereof is 0.5–5 $\mu$m (1.5–2.5 $\mu$m preferably).

Reference numeral 49 is a protective electrode to connect the pixel electrode 51 of each pixel. For the protective electrode 49, it is preferable to use a low-resistance material including aluminum (Al), copper (Cu), or silver (Ag). A cooling effect to lower the heat of the EL layer can be expected from the protective electrode 49. The protective electrode 49 is formed to connect to the drain wiring 32 of the EL driver TFT 202.

A third interlayer insulating film 50 whose thickness is 0.3–1 μm is disposed on the protective electrode 49. The film 50 is made of a silicon oxide film, a silicon nitride oxide film, or an organic resin film. The third interlayer insulating film 50 is provided with an opening on the protective electrode 49 by etching, and the edge of the opening is etched to have a taper shape. Preferably, the angle of the taper is 10–60° (30–50° preferably).

A pixel electrode (a cathode of the EL element) 51 is disposed on the third interlayer film 50. A material that includes magnesium (Mg), lithium (Li) or calcium (Ca) that is small in work function is used as the cathode 51. Preferably, use is made of an electrode made of MgAg (material in which Mg and Ag are mixed in the ratio of Mg:Ag=10:1). Instead, a MgAgAl electrode, a LiAl electrode, or LiFAl electrode can be used.

An EL layer 52 is formed on the pixel electrode 51. The EL layer 52 is used in the form of a single-layer structure or a layered structure. The layered structure is superior in luminous efficiency. Generally, a positive hole injection layer/a positive hole transporting layer/a luminescent layer/an electronic transporting layer are formed on the pixel electrode in this order. Instead, a structure may be used which has the order of positive hole transporting layer/luminescent layer/electronic transporting layer or the order of positive hole injection layer/positive hole transporting layer/luminescent layer/electronic transporting layer/electronic injection layer. In the present invention, any one of the known structures can be used, and fluorescent coloring matter, etc., can be doped to the EL layer.

The EL display device mainly has four color display methods; method of forming three kinds of EL elements that correspond to R(red), G(green), and B(blue), respectively: method of combining an EL element of white luminescence and a color filter (coloring layer): method of combining an EL element of blue or blue-green luminescence and a fluorescent body (fluorescent color conversion layer :CCM): and method of stacking the EL elements that correspond to RGB while using a transparent electrode for a cathode (opposite electrode).

The structure of FIG. 4 is an example in which the method of forming three kinds of EL elements that correspond to RGB is used. Only one pixel is shown in FIG. 4. In fact, pixels, each having the same structure, are formed to correspond to each color of red, green, and blue, and thereby color display can be performed.

The present invention can be performed regardless of the luminescence method, and can use all the four methods. However, since the speed of response of the fluorescent body is slower than that of the EL, and the problem of afterglow occurs, the method in which the fluorescent body is not used is preferable.

Next, a opposite electrode (an anode of an EL element) 53 is formed on the EL layer. In this embodiment, ITO (Indium Tin Oxide) is used as a transparent conductive film.

It is necessary to form a layered body comprised of the EL layer 52 and the opposite electrode 53 by each pixel individually. However, the EL layer 52 is quite weak to water, and a normal photolithography technique cannot be used. Therefore, it is preferable to use a physical mask material, such as metal mask, and selectively form it according to a vapor phase method, such as a vacuum deposition method, a sputtering method, or a plasma CVD method.

It is also possible to use an ink jet method, a screen printing method, spin coating method, and the like, as the method of selectively forming the EL layer. Reference numeral 54 is a second passivation film, and, preferably, the film thickness thereof is 10 nm–1 μm (200–500 nm preferably). A main purpose to dispose the second passivation film 54 is to protect the EL layer 52 from water. It is also effective to give it a cooling effect. However, the EL layer is weak to heat as mentioned above, and film formation should be performed at a low temperature (ranging from a room temperature to 120° C. preferably). Therefore, it can be said that a desirable film formation method is the plasma CVD method, sputtering method, vacuum deposition method, ion plating method, or solution application method (spin coating method).

Therefore, the present invention is not limited to the structure of the EL display device of FIG. 4, which is just one of the preferred embodiments.

According to the above constitution, it is possible to control the luminance of an EL element of objective pixel according to the value of EL driving on voltage applied to the EL element in this embodiment. It is also possible to perform visible the multi gradation display according to the time division gradation display. In more detail, it is possible to display a fine coloring image which have a balanced luminance of red light, blue light and green light realized by a control of EL luminance according to the value of EL driving on voltage applied to the EL element. Further, time division gradation display is performed by a digital signal to attain highly fine image which is well color reproducibility without failure gradation by a dispersion of characteristics of the EL driver TFT.

It is possible to freely combine the constitution of this embodiment with that of an embodiment 1.

Embodiment 3

In this embodiment, a description is here given of a method of simultaneously manufacturing TFTs of a pixel portion and a driving circuit portion around the pixel portion. Concerning the driving circuit, a CMOS circuit that is a base unit is shown in the figure, for a brief description.

First, a substrate 501 in which a base film (not shown) is disposed on the surface thereof is prepared as shown in FIG. 5(A). In this embodiment, a silicon nitride oxide film whose thickness is 200 nm and another silicon nitride oxide film whose thickness is 100 nm are laminated and are used as a base film on a crystallization glass. At this time, preferably, the concentration of nitrogen of the film contacting the crystallization glass substrate is kept to 10–25 wt %. It is possible to form an element directly on the quartz substrate without any base film, of course.

Thereafter, an amorphous silicon film 502 whose thickness is 45 nm is formed on the substrate 501 by a well-known film formation method. There is no need to limit it to the amorphous silicon film. Instead, a semiconductor film (including a microcrystal semiconductor film) that has an amorphous structure can be used in this embodiment. A compound semiconductor film that has an amorphous structure, such as an amorphous silicon germanium film, also can be used herein.

Concerning the steps from here to FIG. 5(C), it is possible to completely cite Japanese Laid-open Patent Publication No. 3032801 filed by the present applicant. This publication discloses a technique concerning a method of crystallizing a semiconductor film, which uses an element, such as Ni, as a catalyst.

First, a protective film 504 that has openings 503a and 503b is formed. A silicon oxide film 150 nm thick is used in this embodiment. A layer 505 (Ni containing layer) that contains nickel (Ni) is formed on the protective film 504 by a spin court method. Concerning the formation of the Ni containing layer, reference can be made to the above publication.

Thereafter, as shown in FIG. 5(B), heating processing at 570° C. for 14 hours is performed in an inert atmosphere, and the amorphous silicon film 502 is crystallized. At this time, crystallization progresses substantially in parallel with the substrate, starting from regions 506a and 506b (hereinafter, designated as Ni addition region) with which Ni is in contact. As a result, a polysilicon film 507 is formed that has a crystal structure in which bar crystals gather and form lines.

Thereafter, as shown in FIG. 5(C), an element (phosphorus preferably) that belongs to 15-family is added to the Ni addition regions 506a and 506b, while leaving the protective film 504 as a mask. Regions 508a and 508b (hereinafter, designated as phosphorus addition region) to which phosphorus was added at high concentration are thus formed.

Thereafter, heat processing at 600° C. for 12 hours is performed in an inert atmosphere as shown in FIG. 5(C). Ni existing in the polysilicon film 507 is moved by this heat processing, and almost all of them are finally captured by the phosphorus addition regions 508a and 508b as shown by the arrow. It is thought that this is a phenomenon caused by the gettering effect of a metallic element (Ni in this embodiment) by phosphorus.

By this process, the concentration of Ni remaining in the polysilicon film 509 is reduced to at least $2'10^{17}$ atoms/cm$^3$ according to the measurement value by SIMS (mass secondary ion analysis). Although Ni is a lifetime killer for a semiconductor, no adverse influence is given to the TFT characteristic when it is decreased to this extent. Additionally, since this concentration is the measurement limit of the SIMS analysis in the current state of the art, it will show an even lower concentration (less than $2'10^{17}$ atoms/cm$^3$) in practice.

The polysilicon film 509 can be thus obtained that is crystallized by a catalyst and is decreased to the level in which the catalyst does not obstruct the operation of a TFT. Thereafter, active layers 510–513 that use the polysilicon film 509 only are formed by a patterning process. At this time, a marker to conduct mask alignment in the following patterning should be formed by using the above polysilicon film. (FIG. 5(D))

Thereafter, a silicon nitride oxide film 50 nm thick is formed by the plasma CVD method as shown in FIG. 5(E), heating processing at 950° C. for 1 hour is then performed in an oxidation atmosphere, and a thermal oxidation process is performed. The oxidation atmosphere can be an oxygen atmosphere or another oxygen atmosphere in which halogen is added.

In this thermal oxidation process, the oxidation progresses in the interface between the active layer and the silicon nitride oxide film, and a polysilicon film whose thickness is about 15 nm is oxidized, so that a silicon oxide film whose thickness is about 30 nm is formed. That is, a gate insulating film 514 of a thickness of 80nm is formed in which the silicon oxide film 30 nm thick and the silicon nitride oxide film 50 nm thick are laminated. The film thickness of the active layers 510–513 is made 30 nm by the thermal oxidation process.

Figure 6A:
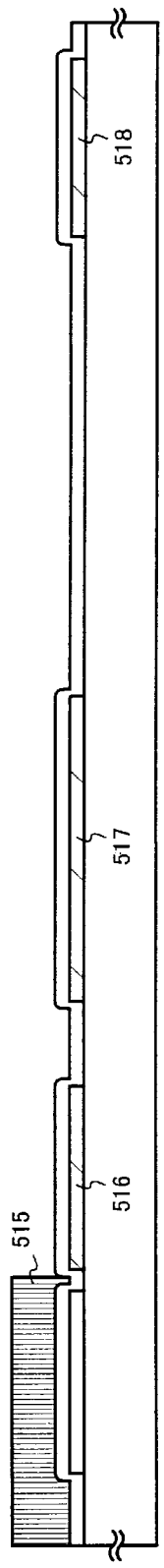
FIGS. 6A to 6D are diagrams showing the method of manufacturing the EL display device.

Thereafter, as shown in FIG. 6(A), a resist mask 515 is formed, and an impurity element (hereinafter, designated as p-type impurity element) that gives the p-type through the medium of the gate insulating film 514 is added. As the p-type impurity element, an element that belongs to 13-family representatively, boron or gallium typically, can be used. This (called a channel dope process) is a process for controlling the threshold voltage of a TFT.

In this embodiment, boron is added by the ion dope method in which plasma excitation is performed without the mass separation of diborane ($B_2H_6$). The ion implantation method that performs the mass separation can be used, of course. According to this process, impurity regions 516–518 are formed that include boron at the concentration of $1'10^{15}$–$1'10^{18}$ atoms/cm$^3$ ($5'10^{16}$–$5'10^{17}$ atoms/cm$^3$ representatively).

Figure 6B:
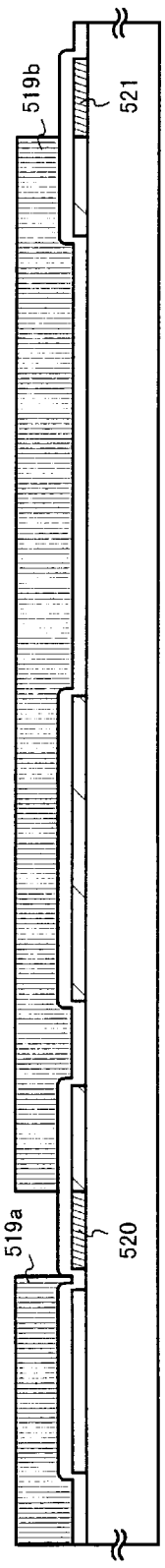

Thereafter, resist masks 519a and 519b are formed as shown in FIG. 6(B), and an impurity element (hereinafter, designated as n-type impurity element) that gives the n-type through the medium of the gate insulating film 514 is added. As the n-type impurity element, an element that belongs to 15-family representatively, phosphorus or arsenic typically, can be used. In this embodiment, a plasma doping method in which plasma excitation is performed without the mass separation of phosphine ($PH_3$) is used. Phosphorus is added in the concentration of $1'10^{18}$ atoms/cm$^3$. The ion implantation method that performs mass separation can be used, of course.

A dose amount is adjusted so that the n-type impurity element is included in the n-type impurity regions 520, 521 formed by this process at the concentration of $2'10^{16}$–$5'10^{19}$ atoms/cm$^3$ ($5'10^{17}$–$5'10^{18}$ atoms/cm$^3$ representatively).

Figure 6C:
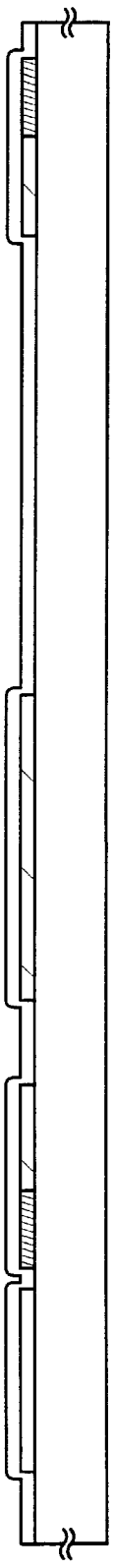
Figure 6D:
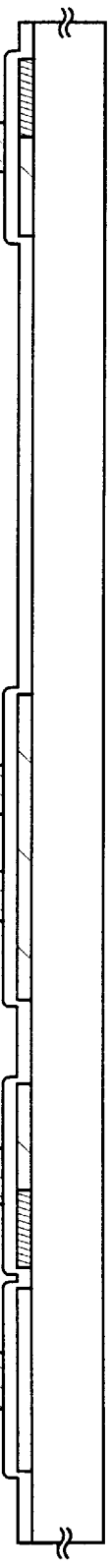

Thereafter, a process is performed for activating the added n-type impurity element and the added p-type impurity element as shown in FIG. 6(C). There is no need to limit the activation means, but, since the gate insulating film 514 is disposed, the furnace annealing process that uses an electrothermal furnace is desirable. Additionally, it is preferable to perform heat processing at a temperature as high as possible because there is a possibility of having damaged the interface between the active layer and the gate insulating film of a part that is a channel formation region in the process of FIG. 6(A).

Since the crystallization glass with high heat resistance is used in this embodiment, the activating process is performed by the furnace annealing processing at 800° C. for 1 hour. The thermal oxidation can be performed keeping a processing atmosphere in an oxidizing atmosphere, or the heat processing can be performed in an inert atmosphere.

This process clarifies the edge of the n-type impurity regions 520, 521, namely, the boundary(junction) between the n-type impurity regions 520,521 and the region (p-type impurity region formed by the process of FIG. 6(A)) around the n-type impurity regions 520, 521, where the n-type impurity element is not added. This means that the LDD region and the channel formation region can form an excellent junction when a TFT is later completed.

Thereafter, a conductive film 200–400 nm thick is formed, and patterning is performed, so that gate electrodes 522–525 are formed. The length of each TFT channel is decided by the line width of those gate electrodes 522–525.

The gate electrode can be made of a conductive film of a single-layer, however, preferably, a lamination film, such as two-layer or three-layer film, is used when necessary. A known conductive film can be used as the material of the gate electrode. Specifically, use can be made of a film of an element selected from the group consisting of tantalum (Ta), titanium (Ti), molybdenum (Mo), tungsten (W), chrome (Cr), and silicon (Si) having conductivity; a film of a nitride of the aforementioned elements (tantalum nitride film, tungsten nitride film, or titanium nitride film representatively); an alloy film of a combination of the aforementioned elements (Mo—W alloy or Mo—Ta alloy representatively); or, a silicide film of the aforementioned elements (tungsten silicide film or titanium silicide film representatively). They can have a single-layer structure or a lamination-layer structure, of course.

In this embodiment, a lamination film is used that is made of a tungsten nitride (WN) film 50 nm thick and a tungsten (W) film 350 nm thick. This can be formed by the sputtering method. By adding an inert gas, such as Xe or Ne, as a spattering gas, the film can be prevented from peeling off because of stress.

At this time, the gate electrodes 523, 525 are formed to overlap with part of the n-type impurity regions 520, 521, respectively, with the gate insulating film 514 therebetween. The overlapping part is later made an LDD region overlapping with the gate electrode. According to the sectional view of the figure, the gate electrodes 524a and 524b are seen as separate, in fact, they are connected electrically to each other.

Thereafter, with the gate electrodes 522–525 as masks, an n-type impurity element (phosphorus in this embodiment) is added self-adjustably, as shown in FIG. 7(A). At this time, an adjustment is performed so that phosphorus is added to the thus formed impurity regions 527–533 at the concentration of ½–1/10(⅓–¼ representatively) of that of the n-type impurity regions 520, 521. Preferably, the concentration is $1'10^{16}$–$5'10^{18}$ atoms/cm$^3$ ($3'10^{17}$–$3'10_{18}$ atoms/cm$^3$ typically).

Thereafter, as shown in FIG. 7(B), resist masks 534a–534d are formed to cover the gate electrode, an n-type impurity element (phosphorus in this embodiment) is then added, and impurity regions 534–541 including a high concentration of phosphorus are formed. The ion dope method using phosphine (PH$_3$) is applied also herein, and an adjustment is performed so that the concentration of phosphorus in these regions is $1'10^{20}$–$1'10^{21}$ atoms/cm$^3$ ($2'10^{20}$–$5'10^{20}$ atoms/cm$^3$ representatively).

A source region or a drain region of the n-channel type TFT is formed through this process, and the switching TFT leaves a part of the n-type impurity regions 530–532 formed in the process of FIG. 7(A). The left region corresponds to the LDD regions 15a–15d of the switching TFT of FIG. 4.

Thereafter, as shown in FIG. 7(C), the resist masks 534a–534d are removed, and a resist mask 543 is newly formed. A p-type impurity element (boron in this embodiment) is then added, and impurity regions 544, 545 including a high concentration of boron are formed. Herein, according to the ion dope method using diborane (B$_2$H$_6$), boron is added to obtain a concentration of $3'10^{20}$–$3'10^{21}$ atoms/cm$^3$ ($5'10^{20}$–$1'10^{21}$ atoms/cm$^3$ representatively).

Phosphorus has been already added to the impurity regions 544, 545 at a concentration of $1'10^{20}$–$1'10^{21}$ atoms/cm$^3$. Boron added herein has at least three times as high concentration as the added phosphorus. Therefore, the impurity region of the n-type formed beforehand is completely changed into that of the p-type, and functions as an impurity region of the p-type.

Thereafter, as shown in FIG. 7(D), the resist mask 543 is removed, and then a first interlayer insulating film 546 is formed. As the first interlayer insulating film 546, an insulating film that includes silicon is used in the form of a single-layer structure or a stacked-layer structure as a combination thereof. Preferably, the film thickness thereof is 400 nm–1.5 μm. In this embodiment, a structure is created in which an 800 nm-thick silicon oxide film is stacked on a 200 nm-thick silicon nitride oxide film.

Thereafter, the n-type or p-type impurity element added at each concentration is activated. The furnace annealing method is desirable as an activation means. In this embodiment, heat treatment is performed at 550° C. for 4 hours in a nitrogen atmosphere in an electro-thermal furnace.

Heat treatment is further performed at 300–450° C. for 1–12 hours in an atmosphere that includes hydrogen of 3–100% for hydrogenation. This is a process to hydrogen-terminate an unpaired connector of a semiconductor film by thermally excited hydrogen. As another means for hydrogenation, plasma hydrogenation (hydrogen excited by plasma is used) can be performed.

Hydrogenation can be performed during the formation of the first interlayer insulating film 546. In more detail, the 200 nm-thick silicon nitride oxide film is formed, and hydrogenation is performed as mentioned above, and thereafter the remaining 800 nm-thick silicon oxide film can be formed.

Thereafter, as shown in FIG. 8(A), contact holes are made in the first interlayer insulating film 546, and source wiring lines 547–550 and drain wiring lines 551–553 are formed. In this embodiment, this electrode is formed with a lamination film of a three-layer structure in which a 100 nm-thick Ti film, a 300 nm-thick aluminum film that includes Ti, and a 150 nm-thick Ti film are continuously formed according to the sputtering method. Other conductive films can be used, of course.

Thereafter, a first passivation film 554 is formed to be 50–500 nm thick (200–300 nm thick representatively). In this embodiment, a 300 nm-thick silicon nitride oxide film is used as the first passivation film 554. A silicon nitride film can be substituted for this.

At this time, it is effective to perform plasma treatment by the use of gas that includes hydrogen, such as H$_2$ or NH$_3$, prior to the formation of the silicon nitride oxide film. Hydrogen excited by this preprocess is supplied to the first interlayer insulating film 546, and, through heat treatment, the film quality of the first passivation film 554 is improved. At the same time, since hydrogen that is added to the first interlayer insulating film 546 diffuses onto the lower side, the active layer can be effectively hydrogenated.

Thereafter, as shown in FIG. 8(B), a second interlayer insulating film 555 made of organic resin is form ed. Polyimide, acrylic fiber, or BCB (benzocyclobutene) can be used as the organic resin. Especially, since the second interlayer insulating film 555 is required to flatten the level differences formed by TFTs, an acrylic film excellent in smoothness is desirable. An acrylic film is formed to be 2.5 μm thick in this embodiment.

Thereafter, contact holes that reach the drain wiring line 553 are made in the second interlayer insulating film 555 and the first passivation film 554, and then a protective electrode 556 is formed. As the protective electrode 556, a conductive film largely composed of aluminum can be used. The protective electrode 556 can be formed according to the vacuum deposition method.

Thereafter, an insulating film (a silicon oxide film in this embodiment) that includes silicon is formed to be 500 nm thick, an opening is then formed at the position corresponding to the pixel electrode, and a third interlayer insulating film 557 is formed. It is possible to easily form a tapered sidewall by using the wet etching method when the opening is formed. If the sidewall of the opening does not have a sufficiently gentle slope, deterioration of the EL layer caused by level differences will lead to an important problem.

Thereafter, a pixel electrode (MgAg electrode) 558 which is a cathode of an EL element is formed. The MgAg electrode 558 is formed using the vacuum deposition method to make the film thickness 180–300 nm (200–250 nm typically).

Next, an EL layer 559 is formed without air exposure by the vacuum deposition method. The film thickness of the EL layer is 80–200 nm (100–120 nm typically).

In this process, an EL layer is sequentially formed for a pixel corresponding to red, a pixel corresponding to green, and a pixel corresponding to blue. However, since the EL layer is poor in tolerance to solutions, they must be independently formed for each color without using the photolithography technique. Thus, it is preferable to conceal pixels except a desired one by the use of the metal mask, and selectively form an EL layer for the desired pixel.

In detail, a mask is first set for concealing all pixels except a pixel corresponding to red, and an EL layer of red luminescence are selectively formed by the mask. Thereafter, a mask is set for concealing all pixels except a pixel corresponding to green, and an EL layer and a cathode of green luminescence are selectively formed by the mask. Thereafter, as above, a mask is set for concealing all pixels except a pixel corresponding to blue, and an EL layer of blue luminescence are selectively formed by the mask. In this case, the different masks are used for the respective colors. Instead, the same mask may be used for them. Preferably, processing is performed without breaking the vacuum until the EL layer are formed for all the pixels.

A known material can be used for the EL layer 559. Preferably, that is an organic material in consideration of driving voltage. For example, the EL layer can be formed with a four-layer structure consisting of a positive hole injection layer, a positive hole transporting layer, a luminescent layer, and an electronic injection layer.

Next, an opposite electrode 560 (anode) is formed. The film thickness of the opposite electrode 560 (anode) is 110 nm. In this embodiment, an indium oxide/tin (ITO) film is formed as the opposite electrode (anode) 560 of the EL element. A transparent conductive film can be used in which zinc oxide (ZnO) of 2–20% is mixed with indium oxide or other well-known materials also can be used.

At the final stage, a second passivation film 561 made of a silicon nitride film is formed to be 300 nm thick.

An EL display device constructed as shown in FIG. 8(C) is completed. In practice, preferably, the device is packaged (sealed) by a highly airtight protective film (laminate film, ultraviolet cured resin film, etc.) or a housing material such as a ceramic sealing can, in order not to be exposed to the air when completed as shown in FIG. 8(C). In that situation, the reliability (life) of the EL layer is improved by making the inside of the housing material an inert atmosphere or by placing a hygroscopic material (for example, barium oxide) therein.

After airtightness is improved by, for example, packaging, a connector (flexible print circuit: FPC) for connecting a terminal drawn from the element or circuit formed on the substrate to an external signal terminal is attached, and a product is completed. In this specification, the EL display device, thus wholly prepared for market, is called EL module.

Note that it is possible to freely combine the constitution of this embodiment with the constitution of embodiment 1.

Embodiment 4

Figure 9:
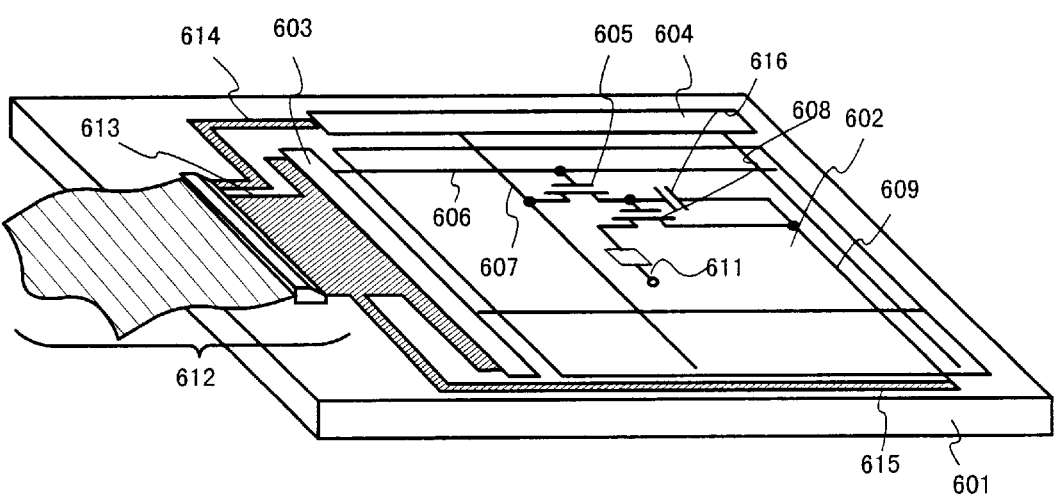
FIG. 9 is a diagram showing an external view of an EL module.

Now, the structure of the EL display device of this embodiment will be described with reference to the perspective view of FIG. 9.

The EL display device of this embodiment is made up of a pixel portion 602, a gate signal side driving circuit 603, and a source side driving circuit 604, each formed on a glass substrate 601. A switching TFT 605 of the pixel portion 602 is an n-channel type TFT, and is disposed at the intersection of a gate wiring line 606 connected to the gate side driving circuit 603 and a source wiring line 607 connected to the source side driving circuit 604. The drain region and the source region of the switching TFT 605 is connected to the source wiring 607 and other is connected to the gate electrode of the EL driver TFT 608.

The source region of the EL driver TFT 608 is connected to a current-feed line 609. A capacitor 616 is provided, which is connected to the gate electrode and the current-feed line 609 of the EL driver TFT 608. In this embodiment, EL driving potential is added to the current-feed line 609. Further, a common potential (0V in this embodiment) of common electrode is added to the opposite electrode (cathode in this embodiment) of the EL element 611.

A FPC 612 which is an external input-output terminal is provided with input wiring lines (connection wiring lines) 613, 614 for transmitting a signal to the driving circuit, and an input-output wiring line 614 connected to the current-feed line 609.

Figure 10A:
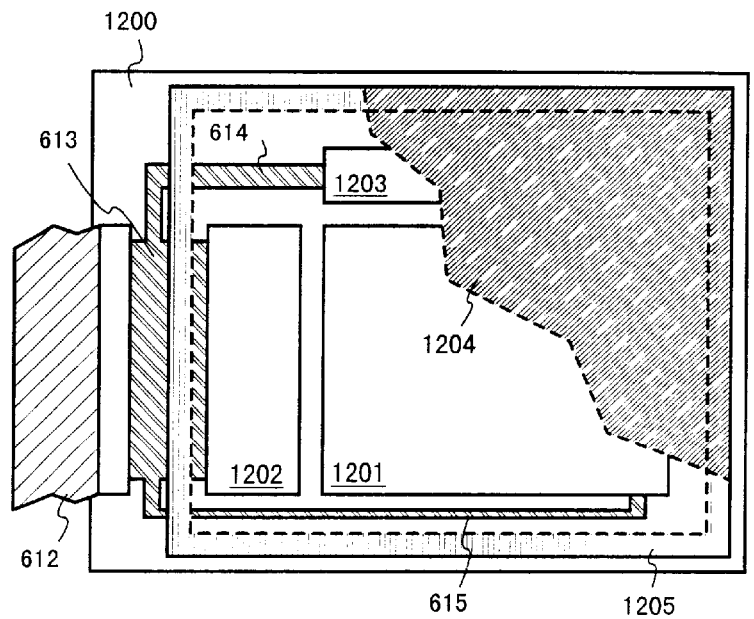
FIGS. 10A and 10B are diagrams showing external views of an EL module.
Figure 10B:
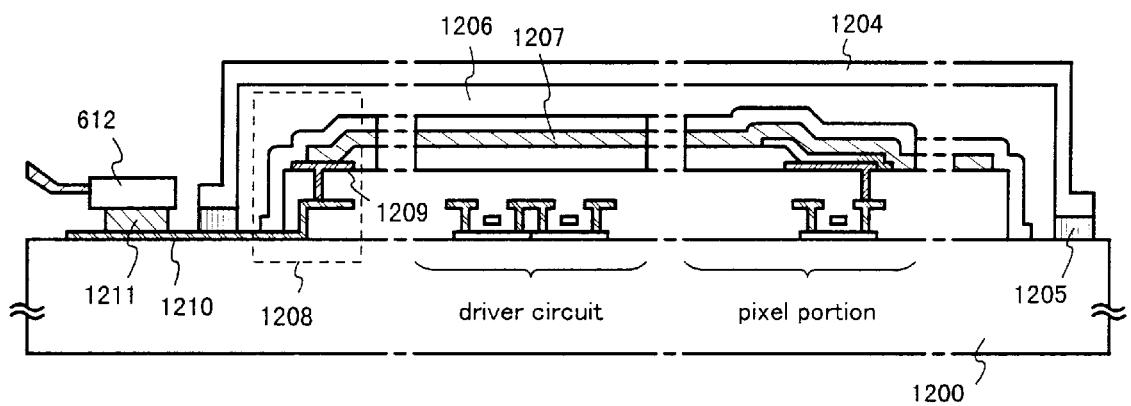

The EL module of this embodiment including housing materials will now be described with reference to FIGS. 10(A) and 10(B). Reference characters used in FIG. 9 are again used when necessary.

A pixel portion 1201, a data signal side driving circuit 1202, and a gate signal side driving circuit 1203 are formed on a substrate 1200. Various wiring lines from each driving circuit are connected to external equipment via the input wiring lines 613–615 and the FPC 612.

At this time, a housing material 1204 is disposed so as to enclose at least the pixel portion, preferably the pixel portion and the driving circuit. The housing material 1204 is shaped As shown in FIG. 10(B), the pixel portion is provided with a plurality of pixels, each having individually isolated EL elements. All of them have a protective electrode 1207 as a common electrode. In this embodiment, a description was given as follows: it is preferable to continuously form the EL layer, the cathode (MgAg electrode), and the protective electrode without air exposure. Instead, if the EL layer and the cathode are formed by using the same mask material, and only the protective electrode is formed by another mask, a structure of FIG. 10(B) will be realized.

At this time, the EL layer and the cathode can be disposed on the pixel portion 1201 only, and are not required to be disposed on the driving circuit 1202 and 1203. No problem will occur even if they are disposed on the driving circuit, of course. However, they should not be disposed thereon in consideration of the fact that an alkali metal is included in the EL layer.

The protective electrode 1207 is connected to an input-output wiring line 1210 in the region shown by reference numeral 1208 through the medium of a connection wiring line 1209 that is made of the same material as the pixel electrode. The input-output wiring line 1210 is a current-feed line to give a EL driving potential to the protective electrode 1207, and is connected to the FPC 611 through the medium of a conductive paste material 1211.

Note that it is possible to freely combine the constitution of this embodiment with the constitution of embodiment 1.

Embodiment 5

It is also possible to apply the present invention to an organic EL material in which to have a concave portion whose internal dimension is larger than the external dimension of the EL element, or is shaped like a sheet. The housing material 1204 is fixed to the substrate 1200 by an adhesive 1205 so as to form closed space in cooperation with the substrate 1200. At this time, the EL element is in a state of being completely enclosed in the closed space, and is completely intercepted from the outside air. A plurality of housing materials 1204 can be disposed.

Preferably, the quality of the housing material 1204 is an insulating substance such as glass or polymer. For example, there is amorphous glass (borosilicate glass, quartz, etc.), crystallization glass, ceramics glass, organic resin (acrylic resin, styrene resin, polycarbonate resin, epoxy resin, etc.) or silicone resin. In addition, ceramics can be used. It is also possible to use metallic materials, such as stainless alloy, if the adhesive 1205 is an insulating material.

As the quality of the adhesive 1205, epoxy resin, acrylate resin, etc., can be used. In addition, thermosetting resin or light curing resin can be used as the adhesive. However, it is required to be a material that does not transmit oxygen and water to the utmost.

Preferably, a gap 1206 between the housing material and the substrate 1200 is filled with inert gas (argon, helium, or nitrogen). However, it is not limited to gas. An inert liquid can be used (for example, liquid fluorocarbon typified by perfluoroalkane). A liquid described in, for example, Japanese Laid-Open Patent Publication Hei 8-78519 be used as the inert liquid.

It is also effective to dispose a drying agent in the gap 1206. A dryer described in Japanese Laid-open Patent Publication Hei 9-148066 can be used as the drying agent. Generally, barium oxide can be used. the light emission brightnesses of red, green, and blue colors all differ. For example, for the case of an organic EL material in which the light emission brightness of the color red is the lowest, and the light emission brightness of the color blue is the highest, in order to adjust the brightnesses of pixels displaying the color red and the brightness of pixels displaying the color green with the brightness of pixels displaying the color blue, an EL display device performs time partitioning gradation display, and an EL driver voltage applied to the EL elements performing red color display and to the EL elements performing green color display may be set so as to become larger than the EL driver voltage applied to the EL elements performing blue color display. Then adding to the above structure, as a countermeasure against degradation of the EL driver TFTs due to hot carrier injection, the channel width (W) of the EL driver TFTs of the red color displaying pixels and the channel width (W) of the EL driver TFTs of the green color displaying pixels are made larger than the channel width (W) of the EL driver TFTs of the pixels displaying the color blue. Further, when the EL driver TFT are n-channel TFTs, the length of an LDD region of the EL driver TFTs of pixels displaying the color red and the length of an LDD region of the EL driver TFTs of pixels displaying the color green may be made longer than the length of an LDD region of EL driver TFTs of blue color displaying pixels. It is possible for the operator to suitably set the channel width (W) of the EL driver TFTs and the length of the LDD region of the EL driver TFTs.

In accordance with the above structure of the present invention, it becomes possible to regulate the light emission brightness of EL elements by the value of the EL driver voltage applied to the EL elements, and it becomes possible to display vivid images with good balance of red color, blue color, and green color light emission brightnesses. In addition, even if the amount of current controlled by the EL driver TFTs increases by the applied voltage becoming larger, degradation of the EL driver TFTs can be suppressed.

Further, it is possible to freely combine the constitution of embodiment 5 with the constitution of any of embodiments 1 to 5.

Embodiment 6

In embodiment 1, it was said that, preferably, an organic EL material is used as an EL layer. However, the present invention can also be performed by using an inorganic EL material. In this case, since the inorganic EL material of the present time is of a very high driving voltage, TFTs to be used must have resisting-pressure characteristics resistible to such a driving voltage.

If an inorganic EL material of an even lower driving voltage is developed in the future, it will be applicable to the present invention.

The structure of this embodiment can be freely combined with any one of the structures of embodiments 1–5.

Embodiment 7

An organic substance used as an EL layer in the present invention may be a low molecular weight organic substance or may be a polymer (high molecular weight) organic substance. Polymer (high molecular weight) organic substances can be formed by simple thin film formation methods such as spin coating (also referred to as solution application), dipping, printing, and ink jet printing, and have a high heat resistance when compared to low molecular weight organic substances.

PPV (polyphenyl vinylene), PVK (polyvinyl carbazole), and polycarbonate or the like can be given as typical polymer organic substances.

Further, it is possible to freely combine the constitution of embodiment 7 with the constitution of any of embodiments 1 to 5.

Embodiment 8

The EL display device (EL module) formed by performing the present invention is superior to a liquid crystal display device in visibility in bright places because of its self-luminous properties. Therefore, the present invention can be used as a display portion of a direct-view type EL display (indicating a display equipped with an EL module). As the EL display, there are a personal computer monitor, a TV receiving monitor, an advertisement display monitor, and so on.

The present invention can be operated to all electronic equipment that includes displays as constituent parts, including the aforementioned EL display.

As the electronic equipment, there are an EL display, video camera, digital camera, head mounted type display, car-navigator, personal computer, portable information terminal (mobile computer, mobile phone, electronic book, etc.), and picture reproducer provided with recording media (specifically, device which can reproduce a recording medium and equip a display capable of displaying the image such as compact disk (CD), laser disc (LD), or digital video disc (DVD)). Examples of the electronic equipment are shown in FIG. 11.

Figures 11A, 11B:
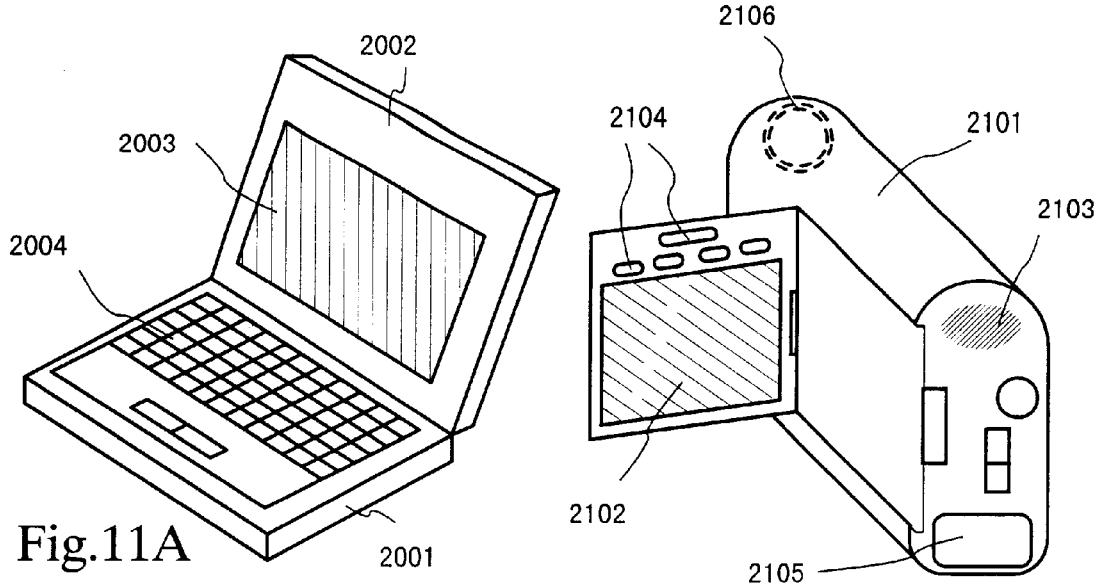

FIG. 11(A) depicts a personal computer, which includes a main body 2001, case 2002, display portion 2003, and keyboard 2004. The present invention can be used as the display device 2003.

FIG. 11(B) depicts a video camera, which includes a main body 2101, display device 2102, voice inputting portion 2103, operation switch 2104, battery 2105, and image reception portion 2106. The present invention can be used as the display device 2102.

Figures 11C, 11D:
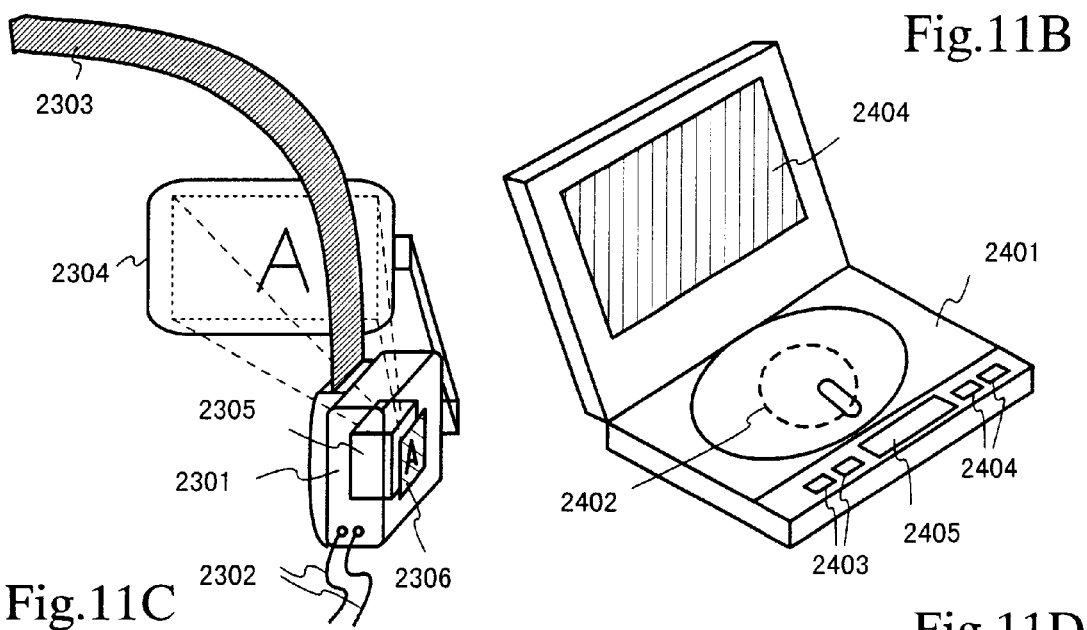

FIG. 11(C) depicts a part of a head mounted type EL display (right side), which includes a main body 2301, signal cable 2302, head fixation band 2303, display monitor 2304, optical system 2305, and display device 2306. The present invention can be used as the display device 2306.

FIG. 11(D) depicts a picture reproducer (specifically, DVD reproducing player) provided with recording media, which includes a main body 2401, recording medium 2402 (CD, LD, DVD, etc.), operation switch 2403, display device (a) 2404, and display panel (b) 2405. The display device (a) chiefly displays image information, and the display device (b) chiefly displays character information. The present invention can be used as the display devices (a) and (b). The present invention is applicable to a CD player or a game machine as a picture reproducer provided with recording media.

Figure 11E:
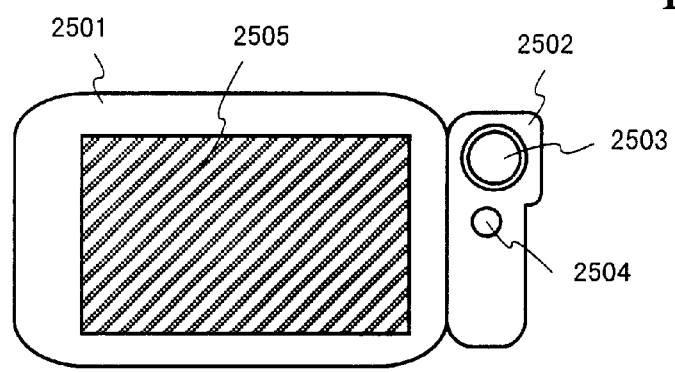

FIG. 11(E) depicts a portable (mobile) computer, which includes a main body 2501, camera 2502, image reception part 2503, operation switch 2504, and display portion 2505. The present invention can be used as the display device 2505.

If the luminescence brightness of the EL material is enhanced in the future, the present invention will be applicable to a front or rear type projector.

The present invention has a quite wide scope of application, as mentioned above, and is applicable to electronic equipment in all fields. The electronic equipment of this embodiment can be realized by the using any structure resulting from the free combination of embodiments 1 to 7.

With the above structure of the present invention, it becomes possible to regulate the light emission brightness of an EL element in accordance with the value of an EL driver voltage applied to the EL element, and it becomes possible to display a vivid image with good balance between the brightnesses of red color, blue color, and green color light emissions. In addition, even if the amount of current controlled by an EL driver TFT increases due to the applied voltages becoming larger, deterioration of the EL driver TFT can be suppressed.

What is claimed is:

1. An electro luminescence display device comprising:
    a first pixel comprising a first electro luminescence element, a first thin film transistor for controlling light emission from the first electro luminescence element, and a second thin film transistor; and
    a second pixel comprising a second electro luminescence element, a third thin film transistor for controlling light emission from the second electro luminescence element, and a fourth thin film transistor,
    wherein the first thin film transistor comprises a first channel and a first lightly doped drain region, and the first lightly doped drain region has a first length in the longitudinal direction of the first channel,
    wherein the third thin film transistor comprises a second channel and a second lightly doped drain region, and the second lightly doped drain region has a second length in the longitudinal direction of the second channel,
    wherein the first length is longer than the second length, and
    wherein a first voltage applied to the first electro luminescence element is higher than a second voltage applied to the second electro luminescence element.

2. An electronic device comprising the electro luminescence display device according to claim 1 is selected from the group consisting of a video camera, digital camera, car-navigator, personal computer, and mobile phone.

3. The electro luminescence display device according to claim 1, each of the first thin film transistor and the second thin film transistor is an n-channel thin film transistor.

4. The electro luminescence display device according to claim 1, wherein light emitted from the first electro luminescence element has a first color and light emitted from the second electro luminescence element has a second color which is different from the first color.

5. An electro luminescence display device comprising:
    a first pixel comprising a first electro luminescence element, a first electro luminescence driver thin film transistor, and a first switching thin film transistor; and
    a second pixel comprising a second electro luminescence element, a
    second electro luminescence driver thin film transistor, and a second switching thin film transistor,
    wherein the first electro luminescence driver thin film transistor
    comprises a first channel an d a first lightly doped drain region and the first light doped drain region has a first length in the longitudinal direction of the first channel,
    wherein the second electro luminescence driver thin film transistor comprises a second channel and a second lightly doped drain region and the second lightly doped drain region has a second length in the longitudinal direction of the second channel,
    wherein the first length is longer than the second length, and
    wherein a first voltage applied to the first electro luminescence element is
    higher than a second voltage applied to the second electro luminescence element.

6. The electro luminescence display device according to claim 5, wherein light emitted from the first electro luminescence element has a first color and light emitted from the second electro luminescence element has a second color which is different from the first color.

7. An electronic device comprising the electro luminescence display device according to claim 5 is selected from the group consisting of a video camera, digital camera, car-navigator, personal computer, and mobile phone.

8. An electro luminescence display device comprising:
    a first pixel comprising a first electro luminescence element, a first electro luminescence driver thin film transistor, and a first switching thin film transistor; and
    a second pixel comprising a second electro luminescence element, a second electro luminescence driver thin film transistor, and a second switching thin film transistor,
    wherein the first electro luminescence driver thin film transistor comprises a first channel with a first width and the second electro luminescence driver thin film transistor comprises a second channel with a second width, wherein the first width is larger than the second width, and
wherein a first voltage applied to the first electro luminescence element is higher than a second voltage applied to the second electro luminescence element.

9. The electro luminescence display device according to claim 8, wherein light emitted from the first electro luminescence element has a first color and light emitted from the second electro luminescence element has a second color which is different from the first color.

10. An electronic device comprising the electro luminescence display device according to claim 8 is selected from the group consisting of a video camera, digital camera, car-navigator, personal computer, and mobile phone.

11. An electro luminescence display device comprising:
- a first pixel comprising a first electro luminescence element, a first thin film transistor electrically connected to the first thin film transistor, and a second thin film transistor; and
- a second pixel comprising a second electro luminescence element, a third thin film transistor electrically connected to the second thin film transistor, and a fourth thin film transistor,
- wherein the first thin film transistor comprises a first channel and a first lightly doped drain region, and the first lightly doped drain region has a first length in the longitudinal direction of the first channel,
- wherein the third thin film transistor comprises a second channel and a second lightly doped drain region, and the second lightly doped drain region has a second length in the longitudinal direction of the second channel,
- wherein the first length is longer than the second length, and
- wherein a first voltage applied to the first electro luminescence element is higher than a second voltage applied to the second electro luminescence element.

12. The electro luminescence display device according to claim 11, each of the first thin film transistor and the second thin film transistor is an n-channel thin film transistor.

13. The electro luminescence display device according to claim 11, light emitted from the first electro luminescence element has a first color and light emitted from the second electro luminescence element has a second color which is different from the first color.

14. An electronic device comprising the electro luminescence display device according to claim 11 is selected from the group consisting of a video camera, digital camera, car-navigator, personal computer, and mobile hone.

15. An electro luminescence display device comprising:
- a first pixel comprising a first electro luminescence element, a first thin film transistor for controlling light emission from the first electro luminescence element, and a second thin film transistor; and
- a second pixel comprising a second electro luminescence element, a third thin film transistor for controlling light emission from the second electro luminescence element, and a fourth thin film transistor,
- wherein the first thin film transistor comprises a first channel with a first width and the third thin film transistor comprises a second channel with a second width,
- wherein the first width is larger than the second width, and
- wherein a first voltage applied to the first electro luminescence element is higher than a second voltage applied to the second electro luminescence element.

16. The electro luminescence display device according to claim 15, each of the first thin film transistor and the second thin film transistor is an n-channel thin film transistor.

17. The electro luminescence display device according to claim 15, light emitted from the first electro luminescence element has a first color and light emitted from the second electro luminescence element has a second color which is different from the first color.

18. An electronic device comprising the electro luminescence display device according to claim 15 is selected from the group consisting of a video camera, digital camera, car-navigator, personal computer, and mobile phone.

19. An electro luminescence display device comprising:
- a first pixel comprising a first electro luminescence element, a first thin film transistor electrically connected to the first electro luminescence element, and a second thin film transistor; and
- a second pixel comprising a second electro luminescence element, a third thin film transistor electrically connected to the second electro luminescence element, and a fourth thin film transistor,
- wherein the first thin film transistor comprises a first channel with a first width and the third thin film transistor comprises a second channel with a second width,
- wherein the first width is larger than the second width, and
- wherein a first voltage applied to the first electro luminescence element is higher than a second voltage applied to the second electro luminescence element.

20. The electro luminescence display device according to claim 19, each of the first thin film transistor and the second thin film transistor is an n-channel thin film transistor.

21. The electro luminescence display device according to claim 19, light emitted from the first electro luminescence element has a first color and light emitted from the second electro luminescence element has a second color which is different from the first color.

22. An electronic device comprising the electro luminescence display device according to claim 19 is selected from the group consisting of a video camera, digital camera, car-navigator, personal computer, and mobile phone.

23. A method for driving an electro luminescence display device comprising a first electro luminescence element and second electro luminescence dement, the method comprising the steps of:
- applying a first voltage to the first electro luminescence element; and
- applying a second voltage to the second electro luminescence element,
- wherein the first voltage is higher than the second voltage,
- wherein the first electro luminescence element is connected to a first electro luminescence driver thin film transistor and the second electro luminescence element is connected to a second electro luminescence driver thin film transistor,
- wherein the first electro luminescence driver thin film transistor comprises a first channel and a first lightly doped drain region and the first lightly doped drain region has a first length in the longitudinal direction of the first channel,
- wherein the second electro luminescence driver thin film transistor comprises a second channel and a second lightly doped drain region and the second lightly doped drain region has a second length in the longitudinal direction of the second channel, and wherein the first length is Longer than the second length.

24. A method for driving an electro luminescence display device comprising a first electro luminescence element and a second electro luminescence element, the method comprising the steps of:

applying a first voltage to the first electro luminescence element; and applying a second voltage to the second electro luminescence element, wherein the first voltage is higher than the second voltage, wherein the first electro luminescence element is connected to a first electro luminescence driver thin film transistor and the second electro luminescence element is connected to a second electro luminescence driver thin film transistor, wherein the first electro luminescence driver thin film transistor comprises a first channel with a first width and the second electro luminescence driver thin film transistor comprises a second channel with a second width, and wherein the first width is larger than the second width.

wherein a first voltage applied to the first electro luminescence element is higher than a second voltage applied to the second electro luminescence element.

25. A method for driving an electro luminescence display device comprising a first electro luminescence element and a second electro luminescence element, the method comprising the steps of:

applying a first voltage to the first electro luminescence element; and applying a second voltage to the second electro luminescence element, wherein the first voltage is higher than the second voltage, wherein the first electro luminescence element is connected to a first thin film transistor and the second electro luminescence element is connected to a second thin film transistor, wherein the first thin film transistor comprises a first channel and a first lightly doped drain region and the first lightly doped drain region has a first length in the longitudinal direction of the first channel, wherein the second thin film transistor comprises a second channel and a second lightly doped drain region and the second lightly doped drain region has a second length in the longitudinal direction of the second channel, and wherein the first length is longer than the second length.

26. The method according to claim 25, the electro luminescence display device performs gradation display by controlling time during which the first electro luminescence element and the second electro luminescence element emit light.

27. A method for driving an electro luminescence display device comprising a first electro luminescence element and a second electro luminescence element, the method comprising the steps of:

applying a first voltage to the first electro luminescence element; and applying a second voltage to the second electro luminescence element, wherein the first voltage is higher than the second voltage, wherein the first electro luminescence element is connected to a first thin film transistor and the second electro luminescence elment is connected to a second thin film transistor, wherein the first thin film transistor comprises a first channel with a first width and the second thin film transistor comprises a second channel with a second width, and wherein the first width is larger than the second width.

28. The method according to claim 27, the electro luminescence display device performs gradation display by controlling time during which the first electro luminescence element and the second electro luminescence element emit light.

* * * * *